(12) United States Patent
Wang et al.

(10) Patent No.: US 11,930,505 B2
(45) Date of Patent: *Mar. 12, 2024

(54) COMMUNICATION METHOD AND COMMUNICATION APPARATUS

(71) Applicant: HUAWEI TECHNOLOGIES CO., LTD., Shenzhen (CN)

(72) Inventors: Jianguo Wang, Beijing (CN); Xu Zhang, Beijing (CN); Lixia Xue, Beijing (CN)

(73) Assignee: Huawei Technologies Co., Ltd., Shenzhen (CN)

(*) Notice: Subject to any disclaimer, the term of this patent is extended or adjusted under 35 U.S.C. 154(b) by 235 days.

This patent is subject to a terminal disclaimer.

(21) Appl. No.: 17/473,670

(22) Filed: Sep. 13, 2021

(65) Prior Publication Data

US 2022/0078770 A1 Mar. 10, 2022

Related U.S. Application Data

(63) Continuation of application No. 16/672,646, filed on Nov. 4, 2019, now Pat. No. 11,122,556, which is a
(Continued)

(30) Foreign Application Priority Data

May 4, 2017 (CN) .......................... 201710309835.9

(51) Int. Cl.
*H04W 72/0446* (2023.01)
*H03M 13/27* (2006.01)
(Continued)

(52) U.S. Cl.
CPC ....... *H04W 72/23* (2023.01); *H03M 13/2778* (2013.01); *H04L 5/0051* (2013.01);
(Continued)

(58) Field of Classification Search
CPC ............. H04W 72/23; H04W 72/0446; H04W 72/0453; H04W 72/04; H04W 80/08;
(Continued)

(56) References Cited

U.S. PATENT DOCUMENTS

| | | | |
|---|---|---|---|
| 2015/0146669 A1* | 5/2015 | Tang | H04L 5/0048 370/329 |
| 2015/0156752 A1* | 6/2015 | Liu | H04L 5/0064 370/329 |

(Continued)

FOREIGN PATENT DOCUMENTS

| | | |
|---|---|---|
| CN | 102420685 A | 4/2012 |
| CN | 102958183 A | 3/2013 |

(Continued)

OTHER PUBLICATIONS

Office Action in Egyptian Appln. No. 2019101670, dated May 22, 2023, 8 pages (with English translation).
(Continued)

*Primary Examiner* — Hassan Kizou
*Assistant Examiner* — Hector Reyes
(74) *Attorney, Agent, or Firm* — Fish & Richardson P.C.

(57) ABSTRACT

The present disclosure relates to communication methods and communication apparatus. One example method includes determining a quantity and a position of control channel element (CCE) used by a control channel of user equipment, where each of the CCE corresponds to a plurality of resource element groups (REGs), the plurality of REGs form at least one REG bundle, and any REG bundle in the at least one REG bundle includes a plurality of resource blocks (RBs) that are consecutive or adjacent in at least one of time domain or frequency domain, and receiving, from a network device, the control channel by using the CCE.

28 Claims, 14 Drawing Sheets

Related U.S. Application Data continuation of application No. PCT/CN2018/085713, filed on May 4, 2018.

(51) Int. Cl.
| | | |
|---|---|---|
| *H04L 5/00* | (2006.01) | |
| *H04W 72/0453* | (2023.01) | |
| *H04W 72/23* | (2023.01) | |
| *H04W 80/08* | (2009.01) | |

(52) U.S. Cl.
CPC ... *H04W 72/0446* (2013.01); *H04W 72/0453* (2013.01); *H04W 80/08* (2013.01)

(58) Field of Classification Search
CPC ... H04L 5/0051; H04L 5/0005; H04L 5/0053; H04L 5/0091; H04L 5/003; H04L 5/0044; H04L 5/0055; H04L 5/0094
See application file for complete search history.

(56) References Cited

U.S. PATENT DOCUMENTS

| | | | |
|---|---|---|---|
| 2015/0282135 A1 | 10/2015 | Jiang et al. | |
| 2015/0295688 A1 | 10/2015 | Pan et al. | |
| 2018/0098307 A1 | 4/2018 | Yang et al. | |
| 2018/0227156 A1* | 8/2018 | Papasakellariou | H04L 5/0053 |
| 2018/0279135 A1 | 9/2018 | Hwang et al. | |
| 2019/0069276 A1* | 2/2019 | Kwak | H04L 1/00 |
| 2019/0165904 A1* | 5/2019 | Jo | H04W 76/11 |
| 2019/0387514 A1* | 12/2019 | Horiuchi | H04W 72/044 |
| 2020/0036497 A1 | 1/2020 | Xu | |

FOREIGN PATENT DOCUMENTS

| | | |
|---|---|---|
| CN | 103313273 A | 9/2013 |
| CN | 103813459 | 5/2014 |
| WO | 2013015627 A2 | 1/2013 |
| WO | 2013009145 A3 | 3/2013 |

OTHER PUBLICATIONS

MediaTek Inc., "Discussion on NR-PDCCH Structure," 3GPP TSG RAN WG1 Meeting #88bis, R1-1704442, Spokane, USA, Apr. 3-7, 2017, 6 pages.

Office Action issued in Egyptian Application No. 2019101670 dated Apr. 20, 2022, 11 pages (with English translation).

Guangdong OPPO Mobile Telecom, "Time-Domain Search Space Design for Multi-beam DL Control Channel," 3GPP TSG RAN WG1 Meeting #88, R1-1701952, Athens, Greece, Feb. 13-17, 2017, 5 pages.

Office Action issued in Chinese Application No. 202111101863.4 dated Nov. 8, 2022, 6 pages.

Ericsson, "On NR-PDCCH Structure," 3GPP TSG-RAN WG1 Meeting#88bis, R1-1706026, Spokane, USA, Apr. 3-7, 2017, 3 pages.

Extended European Search Report issued in European Application No. 18794307.1 dated Mar. 24, 2020, 7 pages.

Guangdong OPPO Mobile Telecom, "On NR PDCCH Structure and CCE-PRB mapping," 3GPP TSG RAN WG1 meeting #88, R1-1701950, Athens, Greece, Feb. 13-17, 2017, 7 pages.

Huawei, HiSilicon, "Search space design considerations," 3GPP TSG RAN WG1 Meeting #88bis, R1-1704202, Spokane, USA, Apr. 3-7, 2017, 4 pages.

Huawei, HiSilicon, "Transmission schemes of DL control channel," 3GPP TSG RAN WG1 Meeting #88bis, R1-1704200, Spokane, USA, Apr. 3-7, 2017, 8 pages.

LG Electronics et al, "WF on resource mapping for NR-PDCCH," 3GPP TSG RAN1 #88bis, R1-1706286, Spokane, USA, Apr. 3-7, 2017, 3 pages.

MediaTek Inc., "Design of Search Space," 3GPP TSG RAN WG1 Meeting #88bis, R1-1704444, Spokane, USA, Apr. 3-7, 2017, 6 pages.

MediaTek Inc., "Discussion on NR-PDCCH Structure," 3GPP TSG RAN WG1 Meeting #88bis, Spokane, USA, Apr. 3-7, 2017, 6 pages.

NTT Docomo, Inc., "Views on NR-PDCCH structure," 3GPP TSG RAN WG1 Meeting #88, R1-1702808, Athens, Greece, Feb. 13-17, 2017, 6 pages.

Panasonic, "The relation among RS, REG, CCE, and CORSET," 3GPP TSG RAN WG1 Meeting #88bis, R1-1705173, Spokane, USA, Apr. 3-7, 2017, 4 pages.

PCT International Search Report and Written Opinion issued in International Application No. PCT/CN2018/085713 dated Jul. 31, 2018, 17 pages (with English translation).

Office Action in Chinese Appln. No. 201710309835.9, dated Mar. 31, 2023, 4 pages.

* cited by examiner

COMMUNICATION METHOD AND COMMUNICATION APPARATUS

CROSS-REFERENCE TO RELATED APPLICATIONS

This application is continuation application of U.S. application Ser. No. 16/672,646, filed on Nov. 4, 2019, now U.S. Pat. No. 11,122,556, which is continuation application of International Application No. PCT/CN2018/085713, filed on May 4, 2018, which claims priority to Chinese Patent Application No. 201710309835.9, filed on May 4, 2017. All of the aforementioned patent applications are hereby incorporated by reference in their entireties.

TECHNICAL FIELD

This application relates to communications field, and in particular, to a communication method and a communication apparatus for sending or receiving control information in field of wireless communications.

BACKGROUND

In a mobile communications system, user equipment detects downlink control information on a time-frequency resource on which a downlink control channel is located, and determines, based on the detected downlink control information, control information corresponding to sending or receiving data, for example, a time-frequency resource position on which the data to be sent/received is located. In the prior art, a time-frequency resource position of a reference signal is predefined, and the user equipment receives the reference signal based on the time-frequency resource position of the reference signal, and performs channel estimation based on the received signal. In an existing LTE system, a physical downlink control channel (PDCCH) is demodulated based on a cell specific reference signal (CRS). CRSs are distributed on a physical resource block (PRB) pair including 12 subcarriers and 14 symbols, and the CRSs do not vary with a PDCCH configuration. For example, CRSs corresponding to two antennas occupy 16 resource elements, and are distributed on 4 symbols in a PRB. In addition, an enhanced physical downlink control channel (EPDCCH) is further introduced in the LTE system. An LTE EPDCCH is demodulated based on a demodulation reference signal (DMRS), and DMRSs of the LTE EPDCCH occupy 12 resource elements, and are distributed on 12 subcarriers and 4 symbols in each resource block used by the EPDCCH.

In a 5th generation New Radio (5G NR) mobile communications system that is being standardized currently, one control channel corresponds to one or more control channel elements (CCE). To be specific, the control channel is mapped, by using the CCE, onto physical time-frequency resources used by the control channel. One CCE may correspond to a particular quantity of resource element groups (REG), for example, four or six REGs. One REG corresponds to one physical resource block (PRB). Different from the existing LTE system, in the 5G NR, one PRB includes 12 consecutive subcarriers in frequency domain and one symbol (not 14 or 12 symbols) in time domain. In other words, one PRB includes 12 resource elements (RE). Each RE occupies one subcarrier and one symbol. In 12 REs included in one REG, some of the REs carry a demodulation reference signal (DMRS) used to demodulate a control channel, and some of the REs carry downlink control information. User equipment (UE) may use the DMRS to obtain a channel estimate, so as to demodulate and decode the downlink control information. Different from an existing LTE PDCCH/EPDCCH, the DMRS used by the control channel in the 5G NR occupies very limited resource overheads, for example, two or four resource elements, and is located only in a PRB or a REG used by the control channel, and reference signal in other symbol or in other PRB cannot be directly used by the control channel. Therefore, reference signals that can be used by the control channel in the 5G NR are very limited. This actually limits channel estimation performance, and consequently causes a difficulty in meeting a coverage performance requirement of the control channel.

SUMMARY

In view of this, this application provides a communication method, to improve channel estimation precision of a control channel, thereby improving transmission reliability of control information. In addition, according to the method, resource reuse efficiency of the control channel and a data channel can be further improved.

According to a first aspect, a communication method for sending control information is provided. The method includes: determining a quantity and a position of a control channel element CCE used by a control channel of user equipment, where each of the CCE corresponds to a plurality of resource element groups REGs, the plurality of REGs form at least one REG set, and any REG set in the at least one REG set includes a plurality of resource blocks RBs that are consecutive or adjacent in time domain and/or frequency domain; and sending the control channel to the user equipment by using the CCE.

In an optional design, the method further includes: determining, by a network device, the at least one REG set from a control resource set based on a REG bundle size or a REG bundle pattern, where the control resource set includes a resource block RB set used to send the control channel, and the RB set includes the plurality of RBs.

In an optional design, the REG bundle size is information predefined based on search space or the control resource set, and/or the REG bundle pattern is information predefined based on search space or the control resource set.

In an optional design, CCE index of each of the CCE corresponds to a plurality of interleaved REG indexes, and the plurality of interleaved REG indexes are obtained based on the REG bundle size or the REG bundle pattern or the REG set.

In an optional design, that the plurality of interleaved REG indexes are obtained based on the REG bundle size or the REG bundle pattern or the REG set specifically includes: grouping, based on the REG bundle size or the REG bundle pattern or the REG set, REG indexes corresponding to the control resource set, and performing interleaving within each group by using a REG set as a granularity.

In an optional design, that the plurality of interleaved REG indexes are obtained based on the REG bundle size or the REG bundle pattern or the REG set specifically includes: grouping and interleaving, based on the REG bundle size or the REG bundle pattern, all REG sets corresponding to the control resource set.

In an optional design, the grouping and interleaving all REG sets corresponding to the control resource set specifically includes:
  interleaving REGs on each symbols respectively in the control resource set; or performing, based on the REG set, grouping with equal-space all the REGs corresponding to the control resource set, and performing interleaving within each group by using the REG set as a granularity.

In an optional design, the network device uses an interleaver to perform the interleaving, and the method further includes:

determining, based on a resource size of the control resource set, a quantity of columns of an interleaving matrix used by the interleaver; and/or sending indication information to the user equipment, where the indication information is used to indicate the quantity of columns of the interleaving matrix used by the interleaver.

According to another aspect, a communication method for receiving control information is provided. The method includes: determining, by user equipment, a quantity and a position of a control channel element CCE used by a control channel of the user equipment, where each of the CCE corresponds to a plurality of resource element groups REGs, the plurality of REGs form at least one REG set, and any REG set in the at least one REG set includes a plurality of resource blocks RBs that are consecutive or adjacent in time domain and/or frequency domain; and receiving, by the user equipment, the control channel from a network device by using the CCE.

In an optional design, the method further includes: determining, by the user equipment, the at least one REG set from a control resource set based on a REG bundle size or a REG bundle pattern, where the control resource set includes a resource block RB set used to receive the control channel, and the RB set includes the plurality of RBs.

In an optional design, the REG bundle size is information predefined based on search space or the control resource set, and/or the REG bundle pattern is information predefined based on search space or the control resource set.

In an optional design, CCE index of each of the CCE corresponds to a plurality of interleaved REG indexes, and the plurality of interleaved REG indexes are obtained based on the REG bundle size or the REG bundle pattern or the REG set.

In an optional design, that the plurality of interleaved REG indexes are obtained based on the REG bundle size or the REG bundle pattern or the REG set specifically includes:

grouping, based on the REG bundle size or the REG bundle pattern or the REG set, REG indexes corresponding to the control resource set, and performing interleaving within each group by using a REG set as a granularity.

In an optional design, that the plurality of interleaved REG indexes are obtained based on the REG bundle size or the REG bundle pattern or the REG set specifically includes:

grouping and interleaving, based on the REG bundle size or the REG bundle pattern, REG sets corresponding to the control resource set.

In an optional design, the grouping and interleaving REG sets corresponding to the control resource set specifically includes:

interleaving REGs on each symbols respectively in the control resource set; or performing, based on the REG set, grouping with equal-space, all REGs corresponding to the control resource set, and performing interleaving within each group by using the REG set as a granularity.

In an optional design, the user equipment uses an interleaver to perform interleaving, and the method further includes:

determining, based on a resource size of the control resource set, a quantity of columns of an interleaving matrix used by the interleaver; and/or receiving indication information sent by the network device, where the indication information is used to indicate the quantity of columns of the interleaving matrix used by the interleaver.

According to still another aspect, this application provides a network device, where the network device can implement a function performed by the network device in the method in the foregoing aspects. The function may be implemented by using hardware, or may be implemented by executing corresponding software by hardware. The hardware or the software includes one or more units or modules corresponding to the foregoing function.

In a possible design, a structure of the network device includes a processor and a transceiver, and the processor is configured to support the apparatus in performing a corresponding function in the foregoing method. The transceiver is configured to support communication between the apparatus and another network element. The apparatus may further include a memory, and the memory is configured to be coupled to the processor, and stores a program instruction and data that are necessary for the apparatus.

According to yet another aspect, this application provides user equipment, and the user equipment can implement a function performed by the user equipment in the method in the foregoing aspects. The function may be implemented by using hardware, or may be implemented by executing corresponding software by hardware. The hardware or the software includes one or more units or modules corresponding to the foregoing function.

In a possible design, a structure of the user equipment includes a processor and a transceiver, and the processor is configured to support the apparatus in performing a corresponding function in the foregoing method. The transceiver is configured to support communication between the apparatus and another network element. The apparatus may further include a memory, and the memory is configured to be coupled to the processor, and stores a program instruction and data that are necessary for the apparatus.

According to still yet another aspect, a communications system is provided, and the communications system includes the network device and the user equipment in the foregoing aspects.

According to a further aspect, a computer program product is provided, and the computer program product includes computer program code. When the computer program code is run by a communications unit, a processing unit, a transceiver, or a processor of user equipment, a network device performs the method in the foregoing implementations.

According to a still further aspect, a computer program product is provided, and the computer program product includes computer program code. When the computer program code is run by a communications unit, a processing unit, a transceiver, or a processor of user equipment, the user equipment performs the method in the foregoing implementations.

According to a yet further aspect, this application provides a computer storage medium, configured to store a computer software instruction used by the foregoing network device, where the computer software instruction includes a program used to execute the designs in the foregoing aspects.

According to a still yet further aspect, this application provides a computer storage medium, configured to store a computer software instruction used by the foregoing user equipment, where the computer software instruction includes a program used to execute the designs in the foregoing aspects.

DESCRIPTION OF EMBODIMENTS

The following describes technical solutions in this application with reference to the accompanying drawings.

Figure 1:
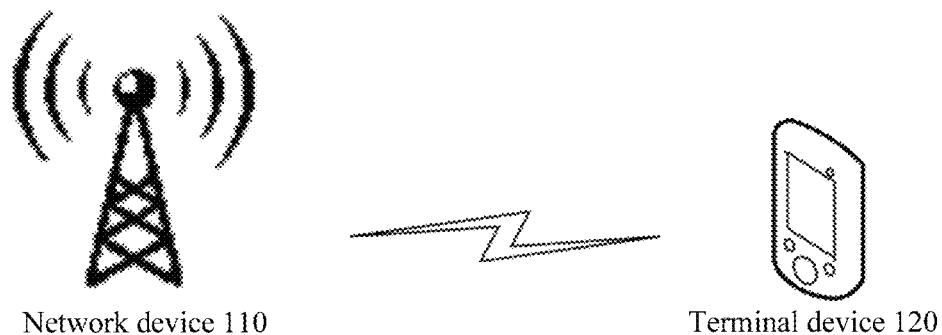
FIG. 1 is a schematic diagram of a communications system applicable to this application.

FIG. 1 shows a communications system 100 applicable to this application. The communications system 100 includes a network device 110 and a terminal device 120, and the network device 110 communicates with the terminal device 120 by using a wireless network. When the terminal device 120 sends data, a wireless communications module may encode information for transmission. Specifically, the wireless communications module may obtain a particular quantity of data bits to be sent to the network device 110 by using a channel. These data bits are, for example, data bits that are generated by a processing module, received from another device, or stored in a storage module. These data bits may be included in one or more transport blocks (which may also be referred to as information blocks or data blocks), and the transport block may be segmented to generate a plurality of code blocks.

In this application, the terminal device may be referred to as an access terminal, user equipment (UE), a subscriber unit, a subscriber station, a mobile station, a mobile station, a remote station, a remote terminal, a mobile device, a user terminal, a terminal, radio communications equipment, a user agent, or a user apparatus. The access terminal may be a cellular phone, a handheld device or a computing device having a wireless communication function, another processing device connected to a wireless modem, an in-vehicle device, a wearable device, or user equipment in a 5G communications system.

The network device may be a base transceiver station (BTS) in a Code Division Multiple Access (CDMA) system, a NodeB (NB) in a Wideband Code Division Multiple Access (WCDMA) system, an evolved NodeB (eNB) in a Long Term Evolution (LTE) system, or a gNB in a 5G communications system. The foregoing base stations are merely examples for description. The network device may be a relay station, an access point, an in-vehicle device, a wearable device, or another type of device.

The foregoing communications system applicable to this application is merely an example for description. A communications system applicable to this application is not limited thereto. For example, the communications system may alternatively include another quantity of network devices and another quantity of terminal devices.

For ease of understanding of this application, before a method for sending control information provided in this application is described, concepts in this application are first described briefly.

Figure 2:
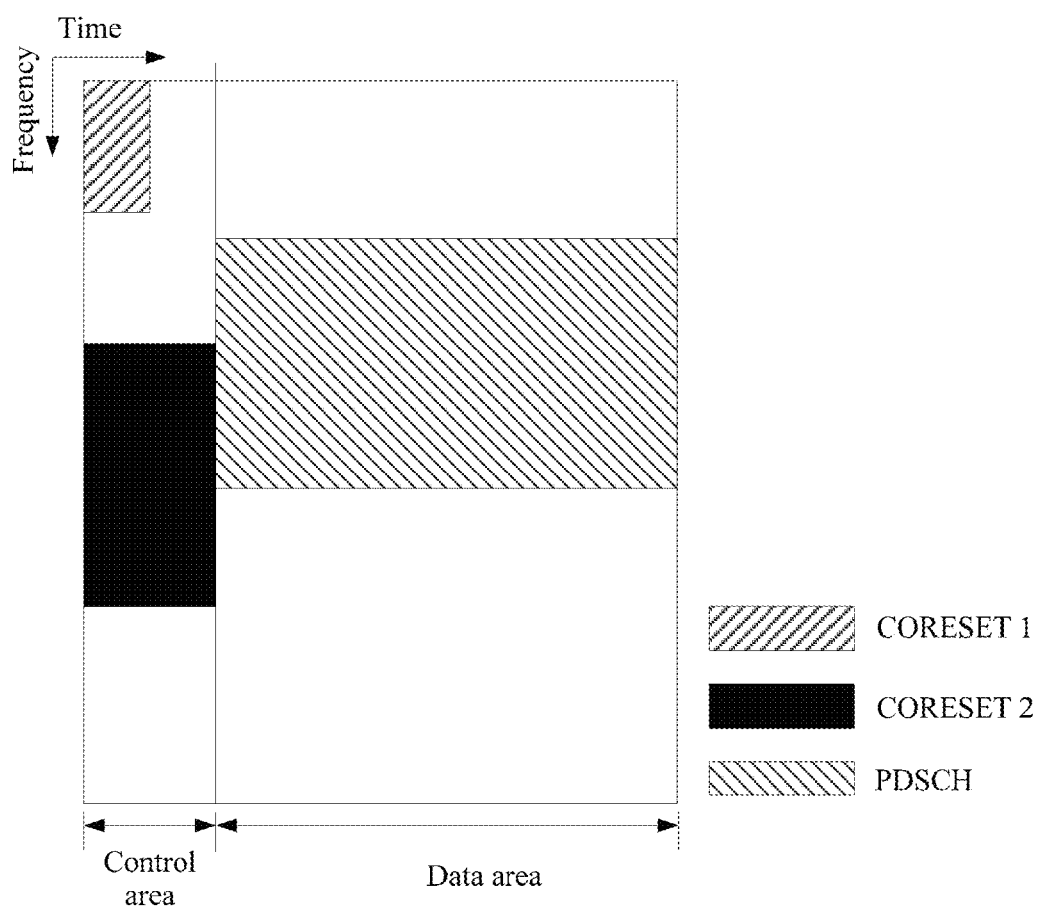
FIG. 2 is a schematic diagram of a control resource set according to this application.

In a 5G mobile communications system, a basic time unit for scheduling downlink resources is a slot. One slot includes 7 or 14 symbols in time domain, and may be divided into a control area and a data area. The data area is used to send a physical downlink shared channel (PDSCH) that carries downlink data. The control area is used to send a physical downlink control channel (PDCCH), and the PDCCH is used to carry downlink control information (DCI). A time-frequency resource used by the PDSCH includes one or more resource blocks (RB) in frequency domain. Each RB includes 12 consecutive subcarriers in frequency domain and one symbol in time domain. One subcarrier in frequency domain and one symbol in time domain are referred to as one resource element (RE). To correctly receive the PDSCH, UE needs to first demodulate the PDCCH. The DCI carried by the PDCCH includes information indicating a position of an RB(s) used by the PDSCH in time/frequency domain, namely, downlink resource allocation information. In a control area of a slot, there is one or more control resource sets (CORESET). The UE can detect the PDCCH on the one or more CORESETs. As shown in FIG. 2, there are two CORESETs in a control area of a slot, and the two CORESETs may occupy resources of different sizes in time domain and frequency domain.

The PDCCH corresponds to one or more control channel elements (CCE). For example, one PDCCH may correspond to 1, 2, 4, 8, or 16 CCEs. A quantity of CCE corresponding to one PDCCH is also referred to as an aggregation level of the PDCCH. A base station may select different aggregation levels based on channel statuses of the UE, so as to change a channel code rate corresponding to the PDCCH, thereby implementing link adaptation.

Each CCE may include one or more resource element groups (REG), for example, six or four REGs. an REG is used to define mapping of the PDCCH onto resource elements REs, equivalently, or define mapping of a CCE corresponding to the PDCCH onto REs. Each REG may correspond to one resource block (RB). An RB set that can be used by a control channel of each UE may be predefined, for example, bandwidth specified with respect to a carrier center is predefined to send or receive a control channel; or may be notified by using higher layer signaling, for example, a control resource set (CORESET) of the UE is notified by using RRC signaling.

Manner of mapping a CCE onto REGs include the following: a localized manner and a distributed manner; a time-first manner, and a frequency-first manner.

In the localized mapping manner, REGs included in a CCE are consecutive in frequency domain or time domain. In the distributed mapping manner, REGs included in a CCE are discrete or partially consecutive in frequency domain or time domain.

When the PDCCH may be mapped onto a plurality of symbols, in the time-first mapping manner, a CCE is mapped onto REGs first in time domain and then in frequency domain. In the frequency-first mapping manner, a CCE is mapped onto REGs first in frequency domain and then in time domain.

Figure 3:
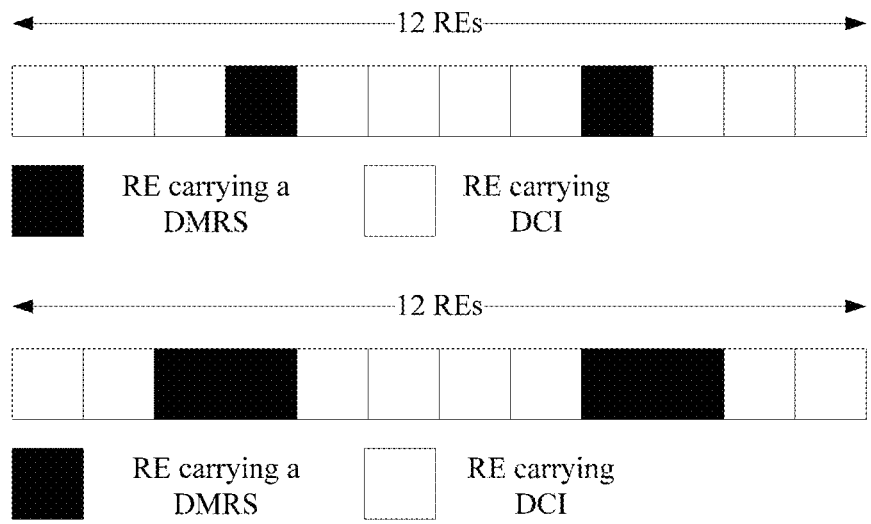
FIG. 3 is a schematic diagram of two possible DMRSs according to this application.

To improve channel estimation precision, a plurality of REGs that are consecutive in frequency domain or time domain may form a REG set. In other words, a plurality of REGs that are consecutive in frequency domain or time domain are bundled to form a REG bundle. The REG set or the REG bundle may also be referred to as a REG group. A specific name of the REG set is not limited in this application. Because a PDCCH is mapped onto REGs by using a CCE(s), a plurality of REGs corresponding to each CCE are bundled to form one or more REG sets. For each REG set, the UE can use an available DMRSs in the REG set instead of a single REG to perform joint channel estimation, thereby improving channel estimation precision. FIG. 3 shows two possible DMRS patterns, and one REG includes two or four REs used for a DMRS.

It should be noted that, a same precoder may be used for a DMRS and DCI that are sent in a same REG on a DMRS-based control channel, so that the UE may directly obtain, from the DMRS, a channel estimate corresponding to the DCI. A precondition for using a DMRS in REGs in a REG set or a REG bundle to perform joint channel estimation is that the REGs included in the REG set or the REG bundle have channel correlation in time domain and/or frequency domain, so that the channel correlation in time domain and/or frequency domain can be used to perform joint channel estimation. For example, a least square or minimum mean square error (MMSE) criterion is used to obtain a channel estimate. If different precoders are used on REGs in a REG set or a REG bundle, and the UE cannot learn the precoders in advance, the UE cannot learn channel correlation between the REGs, included in the REG set or the REG bundle, in time domain and/or frequency domain. Therefore, the UE can use a same precoding matrix (precoder) for the REGs in the REG bundle to perform joint channel estimation. The REGs in the REG bundle are consecutive in time domain and/or frequency domain, so that a plurality of available DMRSs that are bundled in the REG set or the REG bundle can be used to perform joint channel estimation, thereby improving channel estimation precision.

Figure 4:
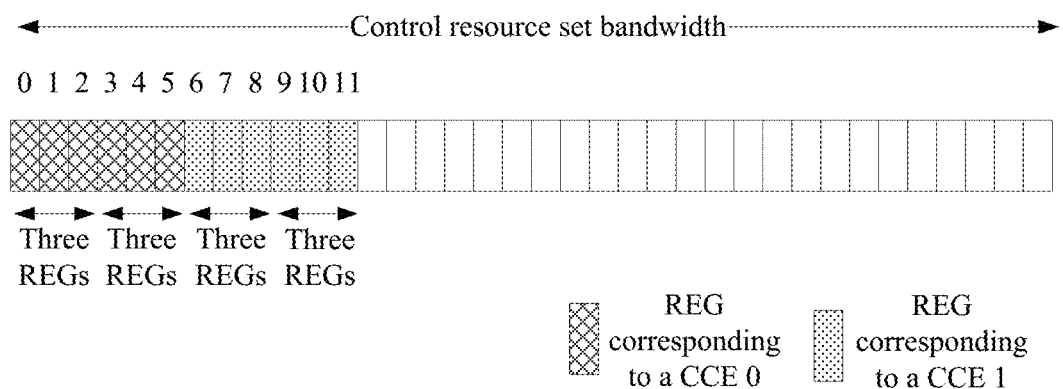
FIG. 4 is a schematic diagram of a localized and frequency-first CCE-to-REG mapping method according to this application.

FIG. 4 shows a localized and frequency-first CCE-to-REG mapping method according to this application. In FIG. 4, a control channel includes two CCEs: a CCE 0 and a CCE 1. Each CCE includes six REGs, and a bundle size of the six REGs is three REGs in frequency domain and one REG in time domain.

Figure 5:
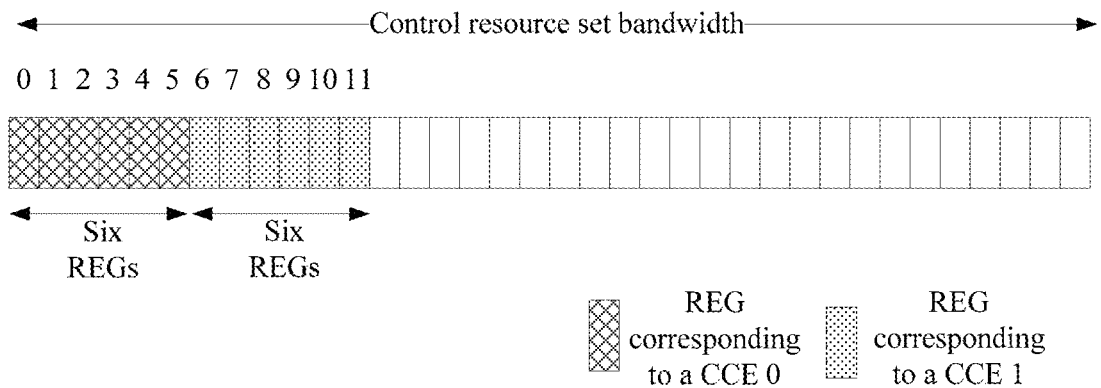
FIG. 5 is a schematic diagram of another localized and frequency-first CCE-to-REG mapping method according to this application.

FIG. 5 shows another localized and frequency-first CCE-to-REG mapping method according to this application. In FIG. 5, a control channel includes two CCEs: a CCE 0 and a CCE 1. Each CCE includes six REGs, and a bundle size of the six REGs is six REGs in frequency domain and one REG in time domain.

Figure 6:
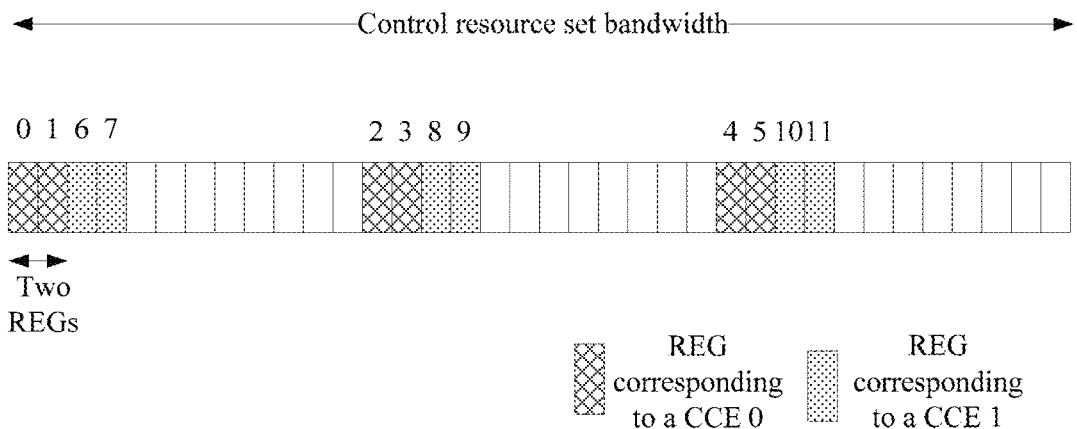
FIG. 6 is a schematic diagram of a distributed and frequency-first CCE-to-REG mapping method according to this application.

FIG. 6 shows a distributed and frequency-first CCE-to-REG mapping method according to this application. In FIG. 6, a control channel includes two CCEs: a CCE 0 and a CCE 1. Each CCE includes six REGs, and a bundle size of the six REGs is two REGs in frequency domain and one REG in time domain.

Figure 7:
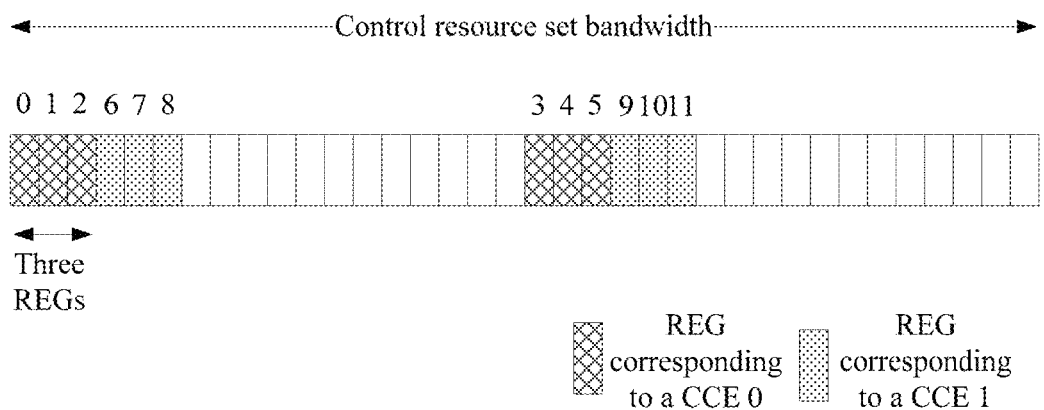
FIG. 7 is a schematic diagram of another distributed and frequency-first CCE-to-REG mapping method according to this application.

FIG. 7 shows another distributed and frequency-first CCE-to-REG mapping method according to this application. In FIG. 7, a control channel includes two CCEs: a CCE 0 and a CCE 1. Each CCE includes six REGs, and a bundling size of the six REGs is three REGs in frequency domain and one REG in time domain.

Figure 8:
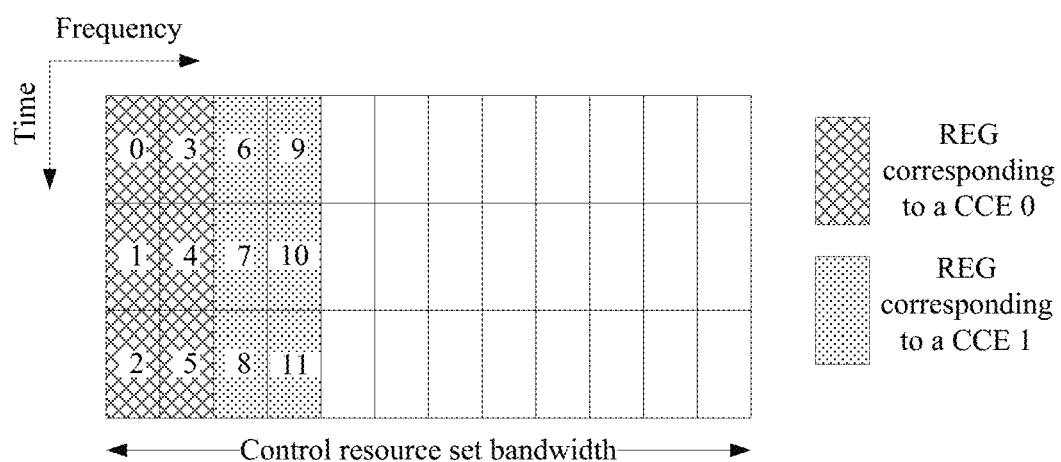
FIG. 8 is a schematic diagram of a localized and time-first CCE-to-REG mapping method according to this application.

FIG. 8 shows a localized and time-first CCE-to-REG mapping method according to this application. In FIG. 8, a control channel includes two CCEs: a CCE 0 and a CCE 1. Each CCE includes six REGs, and a bundling size of the six REGs is two REGs in frequency domain and three REGs in time domain.

Figure 9:
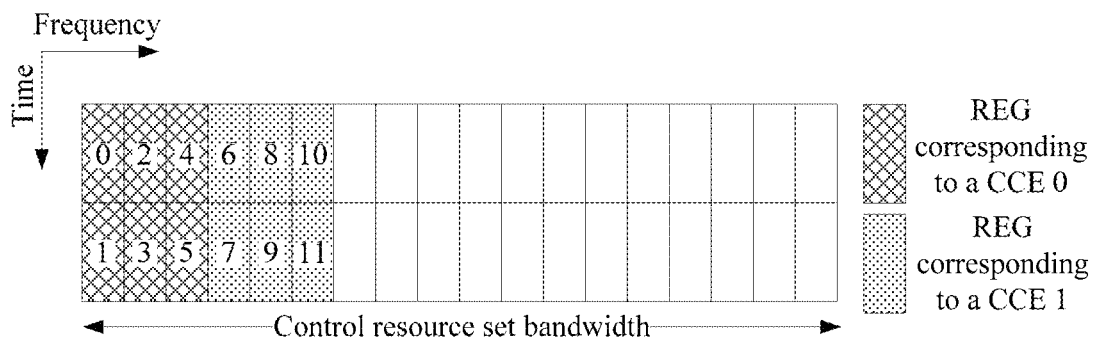
FIG. 9 is a schematic diagram of another localized and time-first CCE-to-REG mapping method according to this application.

FIG. 9 shows another localized and time-first CCE-to-REG mapping method according to this application. In FIG.

9, a control channel includes two CCEs: a CCE 0 and a CCE 1. Each CCE includes six REGs, and a bundling size of the six REGs is three REGs in frequency domain and two REGs in time domain.

Figure 10:
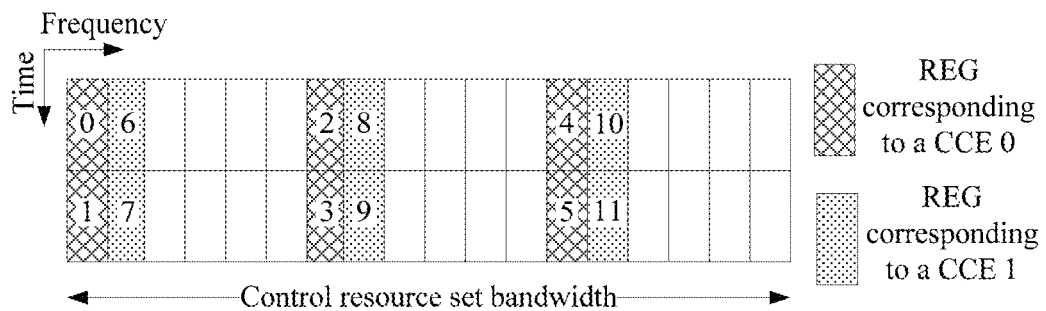
FIG. 10 is a schematic diagram of a distributed and time-first CCE-to-REG mapping method according to this application.

FIG. 10 shows a distributed and time-first CCE-to-REG mapping method according to this application. In FIG. 10, a control channel includes two CCEs: a CCE 0 and a CCE 1. Each CCE includes six REGs, and a bundling size of the six REGs is one REG in frequency domain and two REGs in time domain.

Figure 11:
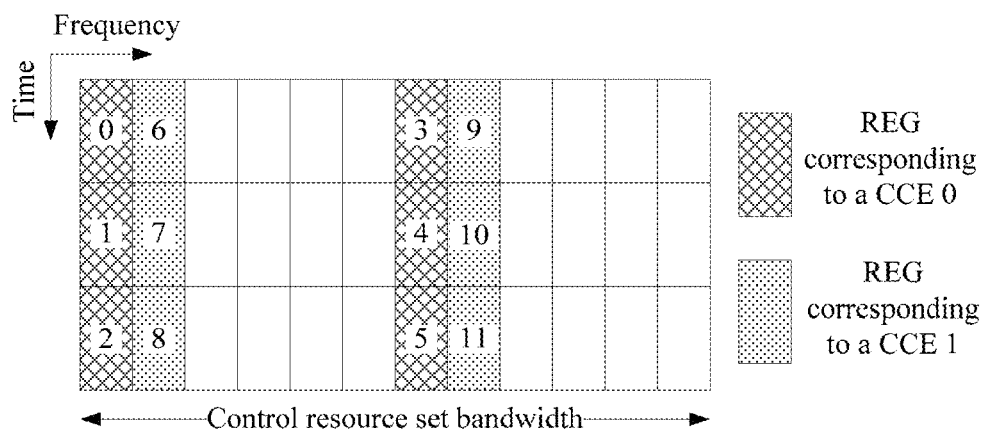
FIG. 11 is a schematic diagram of another distributed and time-first CCE-to-REG mapping method according to this application.

FIG. 11 shows another distributed and time-first CCE-to-REG mapping method according to this application. In FIG. 11, a control channel includes two CCEs: a CCE 0 and a CCE 1. Each CCE includes six REGs, and a bundling size of the six REGs is one REG in frequency domain and three REGs in time domain.

It should be noted that REG sets or REG bundles shown in FIG. 4 to FIG. 11 may be consecutive or inconsecutive in frequency domain.

It may be learned from FIG. 4 to FIG. 11 that, the bundle size limits a resource granularity based on which the control channel can be mapped in frequency domain or time domain. When the bundle size in frequency domain is one REG, the bundle size in time domain may be two or three REGs. When the bundle size in frequency domain is two REGs, the bundle size in time domain may be one or three REGs. When the bundle size in frequency domain is three REGs, the bundle size in time domain may be one or two REGs. When the bundle size in frequency domain is six REGs, the bundle size in time domain may be one REG.

Figure 12:
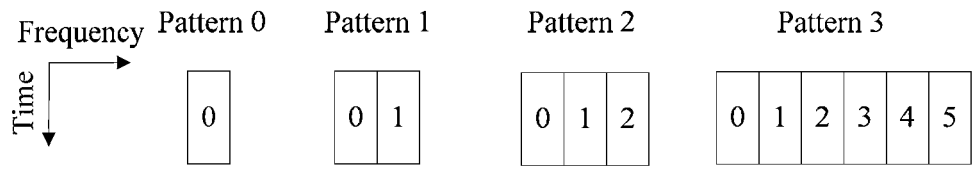
FIG. 12 shows a possible REG set pattern according to this application.
Figure 13:
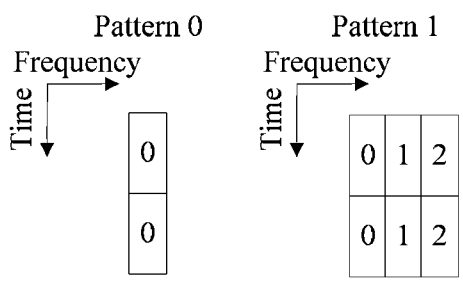
FIG. 13 shows another possible REG set pattern according to this application.
Figure 14:
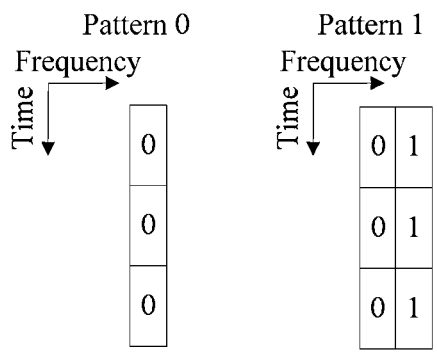
FIG. 14 shows still another possible REG set pattern according to this application.

It may be learned from FIG. 4 to FIG. 11 that, when a CCE corresponds to six REGs, a REG set or REG bundle pattern in a specific implementation may be a pattern 0, 1, 2, or 3 shown in FIG. 12; or a REG set or REG bundle pattern in a specific implementation may be a pattern 0 or 1 shown in FIG. 13; or a REG set or REG bundle pattern in a specific implementation may be a pattern 0 or 1 shown in FIG. 14. REGs given in each REG set or REG bundle pattern are consecutive in time and/or frequency.

The following describes in detail a method for sending and receiving control information according to this application with reference to the accompanying drawings.

Figures 15, 16, 17:
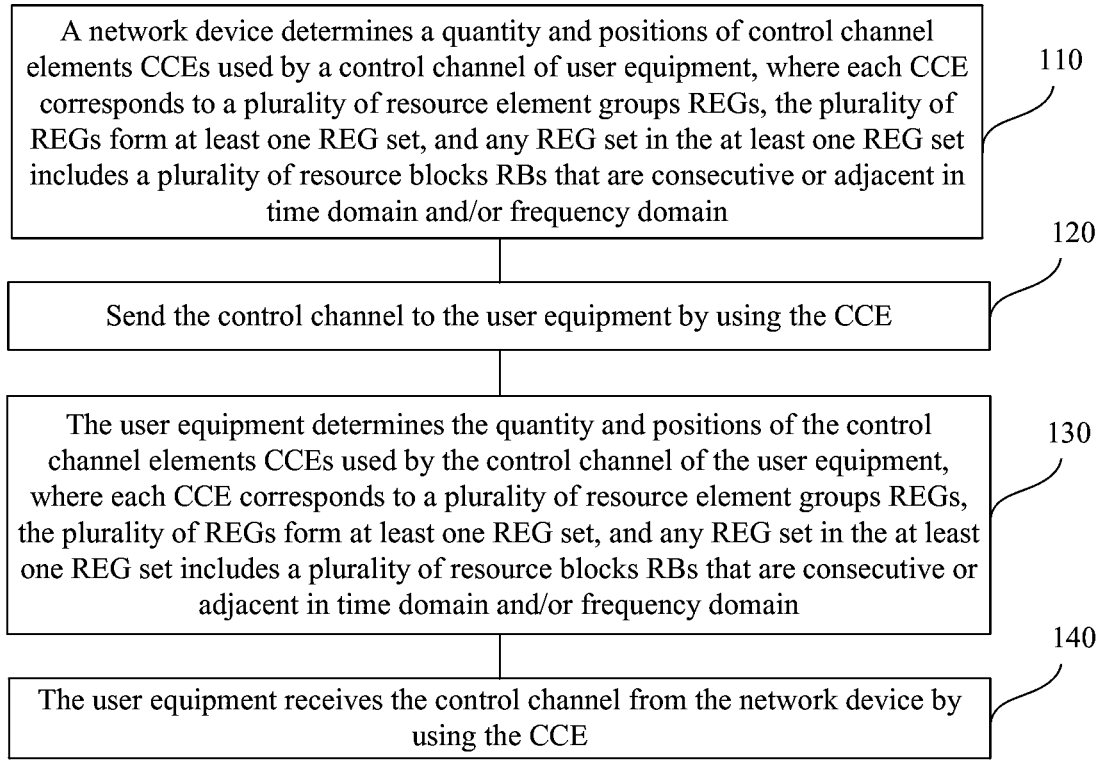
FIG. 15 is a schematic diagram of a communication method for sending and receiving control information according to this application.
FIG. 16 is a schematic diagram of a REG index according to this application.
FIG. 17 is a schematic diagram of another REG index according to this application.

FIG. 15 shows a communication method according to this application, and the communication method may be performed by a base station. The method 100 includes the following steps.

S110: Determine a quantity and a position of a CCE used by a control channel of user equipment UE, where each of the CCE corresponds to a plurality of resource element groups REGs, the plurality of REGs form at least one REG set, and any REG set in the at least one REG set includes a plurality of resource blocks RBs that are consecutive or adjacent in time domain or frequency domain.

Specifically, the control channel may carry scheduling allocation information or other control information.

In this application, the control channel may be, for example, a PDCCH, or may be another control channel configured to transmit control information. A specific name of the control channel is not limited in this application.

The quantity of a CCE used by the control channel of the user equipment UE may be determined by the base station based on a channel condition of the UE. For example, the control channel of the user equipment UE may use 1, 2, 4, 8, or 16 CCEs. Different CCE quantities correspond to different code rates of the control channel. The base station may learn the channel condition, especially a signal to noise ratio SNR, of the UE based on a channel quality indicator (CQI) fed back by the UE. A quantity of CCEs required for meeting a performance requirement is obtained based on the SNR, a performance requirement on, for example, a block error rate BLER or a bit error rate BER, and channel coding performance such as an SNR vs BER curve of the control channel.

The CCE used by the control channel of the user equipment UE may be a plurality of CCEs with a particular CCE index as a start position. For example, the start position may be derived according to a predefined rule or function based on a UE identifier ID, a slot index, a symbol index, or an aggregation level. For example, the start position may be derived according to an indexing function of a start position of an LTE PDCCH or an EPDCCH. Details are not further described herein.

It should be noted that the solution in the present invention for determining the quantity and a position of a CCE may be flexibly selected based on an actual requirement on control information transmission. No limitation is imposed in the present invention. In addition, specifically, the quantity and positions of CCEs may be shown in FIG. 4 to FIG. 11. It should be further noted that REG indexes or numbers shown in FIG. 4 to FIG. 11 are numbered based on CCE indexes. The present invention is not limited by the numbering. For example, the REG indexes may be numbered first in frequency domain and then in time domain in increasing order of frequency domain positions, or may be numbered first in time domain and then in frequency domain, specifically, provided that a CCE index is mapped onto related REG indexes.

S120: Send the control channel to the user equipment UE by using the CCEs.

S130: The user equipment determines the quantity and a position of a control channel elements CCE used by the control channel of the UE, where each of the CCE corresponds to a plurality of resource element groups REGs, the plurality of REGs form at least one REG set, and any REG set in the at least one REG set includes a plurality of resource blocks RBs that are consecutive or adjacent in time domain or frequency domain.

The user equipment determines the quantity and a position of a CCE based on different aggregation levels and a quantity of candidates of the control channel, and each aggregation level corresponds to different CCE quantities. Refer to a process in which user equipment in an existing LTE system determines a start position and a quantity of CCEs. Details are not described herein.

S140: The user equipment receives, by using the CCE, the control channel sent by the network device.

In this application, each of the CCE corresponds to a plurality of resource element groups REGs, for example, the CCE may correspond to six or four REGs. The plurality of REGs form at least one REG set or REG bundle, and any REG set or REG bundle in the at least one REG set or REG bundle includes a plurality of resource blocks RBs that are consecutive or adjacent in time domain or frequency domain. As shown in FIG. 4, FIG. 5, FIG. 6, and FIG. 7, the CCE respectively include two, one, three, and two REG sets or REG bundles, and each REG set or REG bundle includes three, six, three, or two REGs that are consecutive or adjacent in frequency domain.

As shown in FIG. 8, FIG. 9, FIG. 10, and FIG. 11, the CCE respectively include one, one, three, and two REG sets or REG bundles. Each REG set or REG bundle includes six, six, three, or two REGs that are consecutive or adjacent in time domain or in time domain and frequency domain.

In addition, it should be noted that a plurality of REGs that are included in each REG set or REG bundle and that are consecutive or adjacent in time domain or frequency domain may form a different pattern in time domain or frequency domain. For example, as shown in FIG. 12, FIG. 13, and FIG. 14, the REG sets or REG bundles thereof each include REGs that are consecutive or adjacent in frequency domain or time domain or in frequency domain and time domain.

Specifically, a REG in any REG set or REG bundle may correspond to one physical resource block RB.

It should be noted that being adjacent in frequency domain herein means that a plurality of RBs configured for the control resource set may be inconsecutive in frequency domain but after the RBs are arranged in increasing or decreasing order in frequency domain, indexes of the RBs may be consecutive. Being adjacent in time domain herein means that a plurality of RBs configured for the control resource set may be inconsecutive in time domain but after the RBs are arranged in increasing or decreasing order in time domain, indexes of the RBs may be consecutive.

The REGs in the REG set or the REG bundle are consecutive or adjacent in at least one of dimensions of time domain and frequency domain, so that a plurality of DMRSs in bundled REGs may be used to perform joint channel estimation, thereby improving channel estimation precision.

Specifically, because radio channels have correlation in time or frequency, a channel estimate is usually obtained by using a channel estimation algorithm based on correlation in time and/or frequency between a position at which an RE corresponding to a DMRS is located and a position at which an RE corresponding to DCI is located. For example, an actual channel estimation process usually includes two basic steps: First, obtain, by using the least square method based on a DMRS sequence predefined or known in advance, a channel estimate at a position at which an RE corresponding to a DMRS is located. Second, derive, by using a minimum mean square error estimation algorithm based on correlation in time and/or frequency between a position at which the RE corresponding to the DMRS is located and a position at which an RE corresponding to DCI is located, a channel estimate at the position at which the RE corresponding to the DCI is located from the channel estimate at the position at which the RE corresponding to the DMRS is located. Correlation of the radio channels between different RE positions in time and/or frequency is usually obtained based on channel statistics. For example, the correlation in frequency domain may be obtained based on multipath delay characteristics such as delay spread and variance. The correlation in time domain may be obtained based on multipath directional distribution and a Doppler frequency shift characteristic. It should be noted that, the channel estimation algorithm based on the correlation in time or frequency belongs to the prior art. A specific implementation is not limited in the present invention. However, it should be noted that in such a correlation-based channel estimation algorithm, a channel estimate at a position at which an RE corresponding to DCI is located is usually a weighted combination of channel estimates at positions at which REs corresponding to DMRSs are located. More available DMRSs indicate that a channel estimate at the position at which the RE corresponding to the DCI is located can be determined more precisely by using the correlation in time domain or frequency domain.

Therefore, in the present invention, each of the CCE corresponds to a plurality of resource element groups REGs, the plurality of REGs form at least one REG set, and any REG set in the at least one REG set includes a plurality of resource blocks RBs that are consecutive or adjacent in time domain or frequency domain. DMRSs in a plurality of consecutive or adjacent REGs in the REG set can be fully used, and DMRSs in a plurality of adjacent resource blocks in frequency domain and/or a plurality of symbols in time domain can be used to perform joint channel estimation, thereby greatly improving channel estimation performance.

The sending the control channel to the user equipment UE by using the CCE may specifically include:

performing channel coding on control information such as scheduling allocation information and a data transmission format, where the channel coding may be, for example, convolutional coding, Turbo coding, polar coding, LDPC coding, or the like, and rate matching may be performed on the channel coding based on an actual status;

performing modulation, for example, QPSK modulation, on a bit sequence obtained after channel coding, to obtain a complex symbol sequence;

mapping the complex symbol sequence onto one or more CCEs corresponding to the control channel; and mapping the complex symbol sequence corresponding to the one or more CCEs that correspond to the physical channel onto REs in a corresponding REG for sending, where mapping the complex symbol sequence corresponding to the CCE onto specific REs for sending belongs to the prior art, and details are not further described herein.

Correspondingly, the receiving, by the user equipment by using the CCE, the control channel sent by the network device specifically includes:

receiving a complex signal sequence on each RE in the REGs corresponding to the CCE;

obtaining a channel estimate based on a DMRS;

demodulating the complex signal sequence by using the channel estimate;

performing channel decoding on demodulated soft bits and performing a CRC check; and determining DCI based on a CRC check result.

A manner of how the user equipment obtains, based on the received complex signal sequence, control information carried by the control channel belongs to the prior art, and details are not described herein.

The following describes in detail how to determine a position of REGs corresponding to a CCE. In a specific implementation, the method 100 further includes the following steps.

Step A: The network device determines the at least one REG set from a control resource set based on a REG bundle size or a REG bundle pattern.

The control resource set includes a resource block set used to send the control channel.

Step B: The user equipment determines the at least one REG set from a control resource set based on a REG bundle size or a REG bundle pattern.

The control resource set includes a resource block set used to receive the control channel.

Specifically, the control resource set may be predefined. For example, a plurality of consecutive or discrete RBs and a plurality of symbols in time are specified on predefined positions of a frequency band as a control resource set. The predefined control resource set may be specific for a frequency band.

Specifically, the control resource set may be notified to the UE by using signaling. For example, a quantity, positions, and a time length of RBs included in the control resource set are notified to the UE by using RRC signaling. Specific positions of the RBs may be obtained by coding RB indexes by using generalized combinatorial numbers. The time length may be one, two, or three OFDM symbols.

Specifically, the control resource set may alternatively be obtained in a manner of combining the foregoing two manners: predefining a plurality of frequency band specific control resource sets, and indicating one or more of the control resource sets by using RRC signaling.

Each RB in the control resource set may correspond to one REG. REGs corresponding to the control resource set may be numbered first in frequency domain and then in time domain, and arranged in increasing order in frequency domain. For example, for a total of 48 RBs including 2 symbols in time domain and 24 RBs in frequency domain, numbering of REG indexes of the REGs is shown in FIG. 16. The REGs corresponding to the control resource set may be numbered first in time domain and then in frequency domain, and arranged in increasing order in frequency domain. For example, for a total of 48 RBs including 2 symbols in time domain and 24 RBs in frequency domain, numbering of REG indexes of the REGs is shown in FIG. 17. The following uses an example in which REGs are numbered first in frequency domain and then in time domain, and arranged in increasing order in frequency domain, but the present invention is not limited thereto.

The REG bundle size may include a REG bundle size in frequency domain and/or a REG bundle size in time domain. For example, the REG bundle size in frequency domain may be 2, 3, or 6, separately as shown in FIG. 6, FIG. 4, and FIG. 5. The REG bundle size in time domain may be 2 or 3, as shown in FIG. 10 and FIG. 11. The REG bundle size in time domain and frequency domain may be 6, as shown in FIG. 8 and FIG. 9.

The REG bundle or the REG bundle pattern may be shown in FIG. 12, FIG. 13, and FIG. 14. FIG. 12 shows patterns of one, two, three, and six REGs bundled in frequency domain. FIG. 13 shows patterns of two symbols bundled in time domain and one or three REGs bundled in frequency domain. FIG. 14 shows patterns of three symbols bundled in time domain and one or two REGs bundled in frequency domain.

The REG bundle size is predefined, for example, may be predefined based on a control resource set, namely, a control resource set specific REG bundle size; or may be predefined based on search space, for example, a common search space specific REG bundle size or a UE-specific search space specific REG bundle size.

The REG bundle pattern may be predefined, as shown by patterns in FIG. 12, FIG. 13, and FIG. 14.

A quantity of REGs that are consecutive or adjacent in frequency domain or time domain may be obtained from the REG bundle size or the REG bundle pattern.

The REG bundle size or the REG bundle pattern may be predefined based on the control resource set or the search space, and therefore is known to both the base station and the user equipment.

The REG bundle size or the REG bundle pattern may alternatively be notified by the base station to the UE by using signaling, for example, notified to the UE by using higher layer signaling such as RRC signaling. Specifically, for example, the REG bundle size or the REG bundle pattern may be notified to the UE based on the control resource set or search space configuration information.

In a specific implementation, any REG set in the at least one REG set meets at least one of the following conditions:

m consecutive or adjacent PRBs in frequency domain, where m is a positive integer; or n consecutive or adjacent symbols in time domain, where n is a positive integer.

For example, a value of m may be 1, 2, 3, 6, 12, or the like; or 2, 4, 8, or 16. A value of n may be 1, 2, 3, or the like.

It should be noted that being adjacent in frequency domain herein means that a plurality of RBs configured for the control resource set may be inconsecutive in frequency domain but after the RBs are arranged in increasing or decreasing order in frequency domain, indexes of the RBs may be consecutive. Being adjacent in time domain herein means that a plurality of RBs configured for the control resource set may be inconsecutive in time domain but after the RBs are arranged in increasing or decreasing order in time domain, indexes of the RBs may be consecutive.

The determining the at least one REG set from the control resource set based on the REG bundle size or the REG bundle pattern may specifically include:

determining the quantity of REGs that are consecutive or adjacent in frequency domain and/or time domain based on the REG bundle size or the preset REG bundle pattern;

obtaining all REG indexes based on the control resource set, where as described above, the REG indexes are numbered first in frequency domain and then in time domain or first in time domain and then in frequency domain; and obtaining, based on the quantity of REGs that are consecutive or adjacent in frequency domain and/or time domain, a set of REG indexes corresponding to each REG set index.

Figure 18:
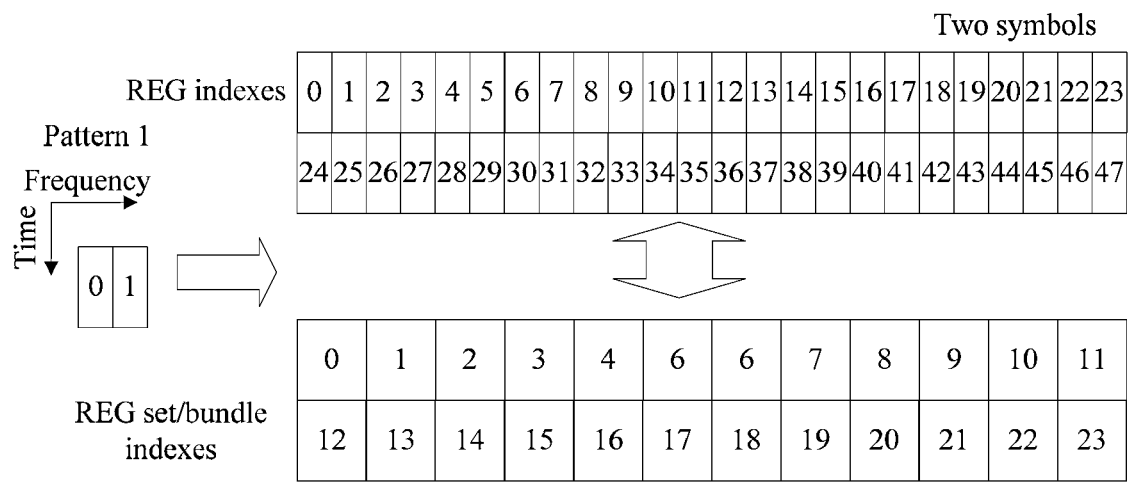
FIG. 18 is a schematic diagram of a REG bundle size according to this application.

For example, REGs in a control resource set shown in FIG. 16 are bundled based on a bundle size of 2 in frequency domain or a REG bundle pattern 1 shown in FIG. 18, to obtain 24 REG sets or REG bundles shown in FIG. 18. For example, a REG set or REG bundle 0 includes a REG 0 and a REG 1; a REG set or REG bundle 1 includes a REG 2 and a REG 3; and so on.

Figure 19:
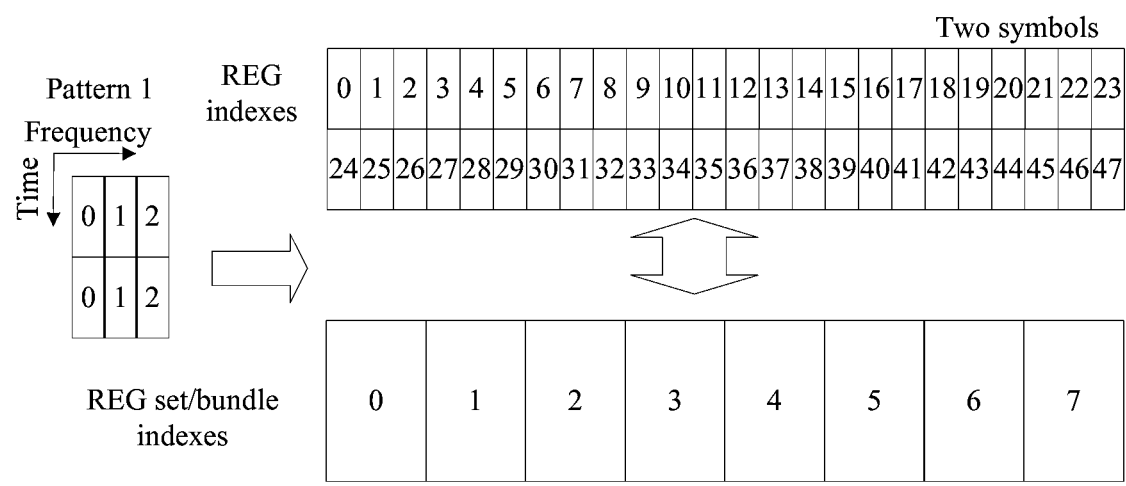
FIG. 19 is a schematic diagram of another REG bundle size according to this application.

For another example, REGs in a control resource set shown in FIG. 16 are bundled based on a bundle size of 3 in frequency domain and a bundle size of 2 in time domain, or a REG bundle pattern 1 shown in FIG. 19, to obtain eight REG sets or REG bundles shown in FIG. 19. For example, a REG set or REG bundle 0 includes REGs 0, 1, 2, 24, 25, and 26; a REG set or REG bundle 1 includes REGs 3, 4, 5, 27, 28, and 29; and so on.

In a specific implementation, time-frequency positions of the plurality of REGs corresponding to each CCE are determined based on REG indexes corresponding to each CCE index.

In a specific implementation, a CCE index may correspond to a plurality of consecutive REG indexes in sequence. For example, a CCE index corresponds to six consecutive REG indexes in sequence. For example, a REG set in FIG. 18 is used as an example, REG indexes corresponding to a CCE index x may be 6x, 6x+1, 6x+2, . . . , 6x+5, where x=0, . . . 7.

In a specific implementation, CCE index of each of the CCE corresponds to at least one interleaved REG index, and the interleaved REG index is obtained based on the REG bundle size or the REG bundle pattern or the REG set.

Specifically, the interleaved REG index is obtained by interleaving REG indexes corresponding to the control resource set based on the REG bundle size or the REG bundle pattern. Equivalently, the interleaved REG index is obtained by interleaving REG indexes corresponding to the control resource set based on the REG set or the REG bundle.

For example, a control resource set and a REG bundle size or a REG bundle pattern in FIG. 18 are used as an example. A REG set or a REG bundle that is formed based on the REG bundle size or the REG bundle pattern may be used as an interleaving granularity, to form 24 REG sets or REG bundles, and each CCE corresponds to three REG sets or REG bundles, that is, six REGs.

That a REG set or a REG bundle is used as an interleaving granularity means that REG indexes corresponding to the REG set or the REG bundle form an N-tuple, where N is a quantity of REGs corresponding to the REG set or the REG bundle, and all N-tuples are interleaved.

Equivalently, performing interleaving by using the REG set or the REG bundle as an interleaving granularity may include:

interleaving a REG set or a REG bundle corresponding to the control resource set, to obtain an interleaved REG set or REG bundle index; and accordingly determining interleaved REG indexes based on the interleaved REG set or REG bundle index.

In a specific implementation, a row-in column-out interleaver may be used, and inter-column re-arrangement based on bit inversion may be used. A principle of the interleaver is similar to that of an interleaver used for an LTE convolutional code or Turbo code. Specifically, the principle includes:

obtaining a quantity $N_C$ of columns of an interleaving matrix used by the row-in column-out interleaver, where the quantity of columns may be predefined, for example, may be 32 or 16 columns, or may be notified by the base station to the UE by using RRC signaling; and the quantity of columns may be specific to a control resource set or search space;

obtaining, based on a quantity of REG sets or REG bundles, a quantity $N_R$ of rows of the interleaving matrix used by the interleaver, where $N_R$ is a smallest integer not less than Q, and Q is a quotient obtained by dividing the quantity of REG sets or REG bundles by the quantity of columns of the interleaving matrix; and the rows of the matrix are numbered in decreasing order;

sequentially writing, row by row, the N-tuples corresponding to the REG set or REG bundle into the matrix starting from row 0 column 0, and if $N_R$ is greater than Q, which means that the quantity of REG sets or REG bundles is not divisible by the quantity of columns of the interleaving matrix, padding the last row with NULLs;

re-arranging the columns of the matrix based on a specified inter-columns interleaving pattern; and sequentially reading, column by column, from the matrix to obtain interleaved N-tuples, which include REG indexes.

The inter-column interleaving pattern may be based on bit inversion (bit reverse). For example, an inter-column interleaving pattern corresponding to 32 columns is as follows, where $<P(0), P(1), \ldots, P(N_C-1)>$ is column position indexes obtained after interleaving.

| Quantity of columns | Inter-column interleaving pattern $<P(0), P(1), \ldots, P(N_C - 1)>$ |
|---|---|
| 32 | <0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31> | or

| Quantity of columns | Inter-column interleaving pattern $<P(0), P(1), \ldots, P(N_C - 1)>$ |
|---|---|
| 32 | <1, 17, 9, 25, 5, 21, 13, 29, 3, 19, 11, 27, 7, 23, 15, 31, 0, 16, 8, 24, 4, 20, 12, 28, 2, 18, 10, 26, 6, 22, 14, 30> |

Figure 20:
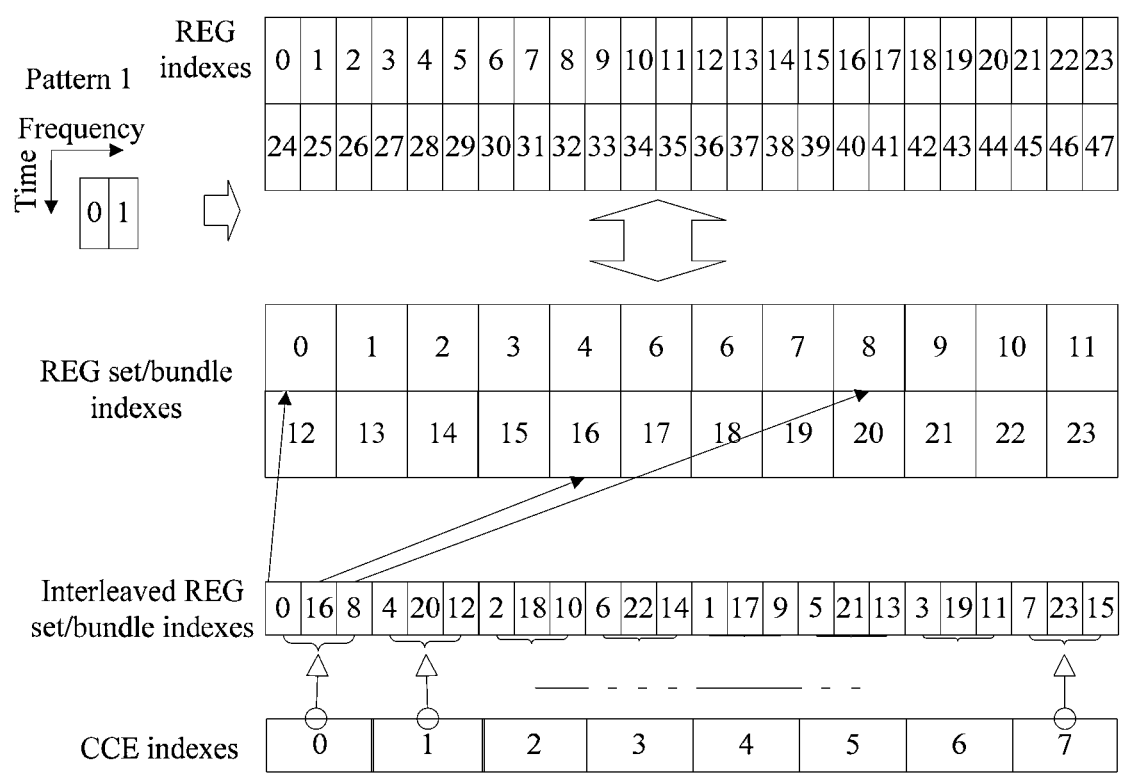
FIG. 20 is a schematic diagram of an interleaved REG set index according to this application.

For example, a control resource set and a REG bundle size or a REG bundle pattern in FIG. 18 are used as an example. Interleaved REG set or REG bundle indexes are obtained, as shown in FIG. 20. REG set or REG bundle indexes corresponding to CCE 0 are 0, 16, and 8 in sequence, which correspond to REG indexes of 0, 1, 32, 33, 16, and 17.

In the foregoing embodiment, REGs or REG sets or REG bundles corresponding to a CCE or a control channel are distributed in different times or frequencies, so that time or frequency selectivity of a radio channel can be fully used. Therefore, a time or frequency diversity gain can be obtained.

Figure 21:
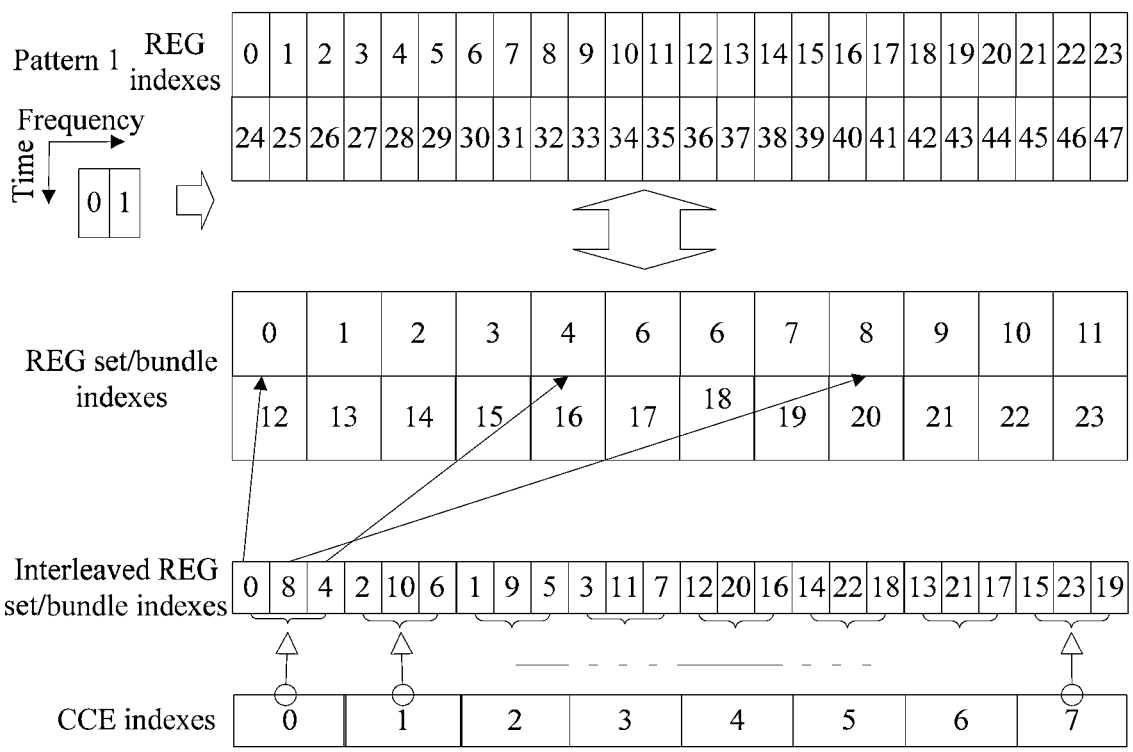
FIG. 21 is a schematic diagram of another interleaved REG set index according to this application.

In a specific implementation, REGs on each symbol in a control resource set may be interleaved by using an interleaver based on a REG bundle size or a REG bundle pattern. For example, REGs on two symbols shown in FIG. 18 are separately interleaved by using the foregoing interleaver to obtain REG set or REG bundle indexes and corresponding REG indexes, as shown in FIG. 21. In this embodiment, frequency-first CCE-to-REG mapping can be implemented.

In the foregoing embodiment, REGs or REG sets or REG bundles corresponding to a CCE or a control channel are distributed on a same symbol but in different frequencies. A frequency diversity gain can be obtained. In addition, the control channel may be located on a single symbol, so that fast hybrid automatic repeat request (HARQ)-acknowledgment/negative acknowledgment (ACK/NACK) feedback can be implemented. Moreover, this is particularly applicable to a URLLC service scenario.

Figure 22:
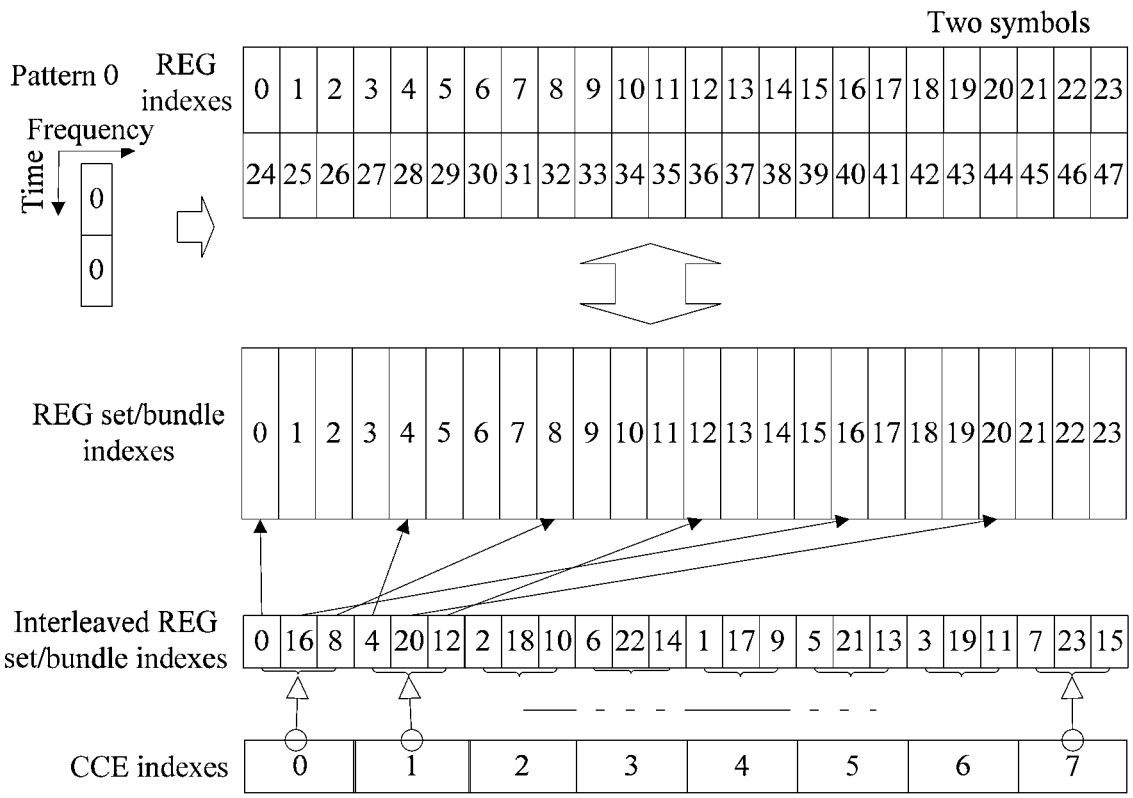
FIG. 22 is a schematic diagram of still another interleaved REG set index according to this application.

In a specific implementation, time-first CCE-to-REG mapping can be implemented based on a REG bundle size or a REG bundle pattern. As shown in FIG. 22, a REG bundle pattern corresponds to two REGs bundled in time domain. All REGs in a control resource set are interleaved based on a REG bundle size or a REG bundle pattern. In this embodiment, time-first CCE-to-REG mapping can be implemented.

In the foregoing embodiment, REGs or REG sets or REG bundles corresponding to a CCE or a control channel can implement time-first CCE-to-REG mapping. A frequency diversity gain can be obtained. In addition, a control channel may be located on different symbols, and power headroom on the symbols can be used to perform power boosting on the control channel, especially on a DMRS on the control channel, thereby improving channel estimation performance and enhancing control channel coverage.

Figure 23:
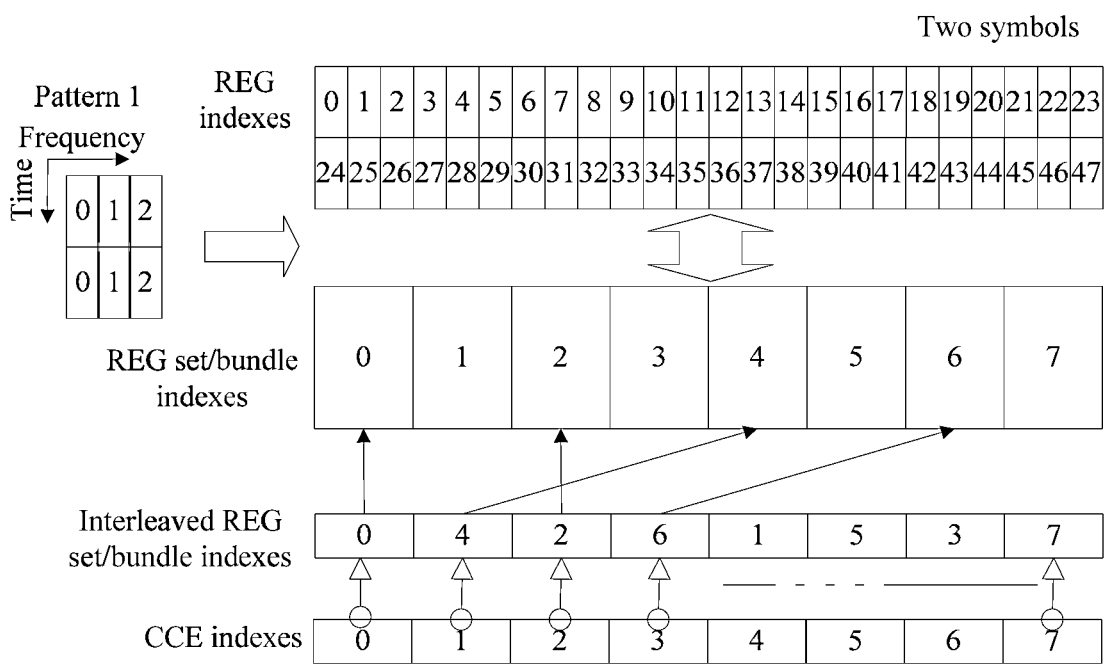
FIG. 23 is a schematic diagram of yet another interleaved REG set index according to this application.

In a specific implementation, frequency-first CCE-to-REG mapping can be implemented based on a REG bundle size or a REG bundle pattern in time domain and frequency domain. As shown in FIG. 23, a REG bundle pattern corresponds to two REGs bundled in time domain and three REGs bundled in frequency domain. All REGs in a control resource set are interleaved based on a REG bundle size or a REG bundle pattern, thereby actually implementing CCE-granularity interleaving.

In the embodiments shown in FIG. 20 to FIG. 23, REGs corresponding to a control resource set are interleaved by using a REG set or a REG bundle as an interleaving granularity based on a REG bundle size or a REG bundle pattern. DMRSs in the REG set or the REG bundle can be used to perform joint channel estimation, thereby improving channel estimation precision. In addition, a case in which different REGs in a REG set or a REG bundle are distributed on different CCEs is effectively avoided, thereby effectively decreasing receiving complexity. Moreover, that the REG bundle is used as an interleaving granularity may be predefined or obtained through configuration, so that a resource granularity of the control channel can match that of a data channel.

On each occasion of sending a control channel, a CCE actually used to send the control channel may occupy only some of time-frequency resources in a control channel resource set in most cases, or may occupy all the time-frequency resources. In a 5G mobile communications system, a reference signal used to demodulate the control channel and DCI are located only in a control area in which a control resource set is located. In addition, when no control information is sent, a base station does not send the reference signal and the DCI in a time-frequency resource area in which the control channel is sent. Therefore, in the control channel resource set, if a CCE actually used to send the control channel does not occupy all the time-frequency resources in the control channel resource set, remaining control channel resources in the control channel resource set can be used to send a PDSCH.

On each occasion of receiving a control channel, a CCE actually used to receive the control channel may occupy only some of time-frequency resources in a control channel resource set in most cases, or may occupy all the time-frequency resources. In a 5G mobile communications system, a reference signal used to demodulate the control channel and DCI are located only in a control area in which a control resource set is located. In addition, when a base station does not send control information, the base station does not send the reference signal and the DCI in a time-frequency resource area in which the control channel is sent. Therefore, in the control channel resource set, if a CCE actually used to receive the control channel does not occupy all the time-frequency resources in the control channel resource set, remaining control channel resources in the control channel resource set can be used to receive a PDSCH.

In a specific implementation, that the interleaved REG indexes are obtained based on the REG bundle size or the REG bundle pattern or the REG set may further include: grouping, based on the REG bundle size or the REG bundle pattern or the REG set, REG indexes corresponding to the control resource set, where REG indexes included in each group correspond to a plurality of REG sets or REG bundles.

In a specific implementation, a set of REGs in one group and a set of REGs in another group may overlap, or may not overlap.

REG indexes in each group are interleaved based on the REG bundle size or the REG bundle pattern or the REG set.

Specifically, REGs in a group may be interleaved by using a REG set or REG bundle as a granularity. Interleaved REG indexes are obtained from the interleaved REG set or REG bundle index.

In a specific implementation, the method 100 includes the following steps:

Step C: Group and interleave, based on the REG bundle size or the REG bundle pattern, REG sets or REG bundles corresponding to the control resource set, to obtain interleaved REG sets or REG bundle indexes.

Step D: Determine interleaved REG indexes based on the interleaved REG sets or REG bundle indexes.

In a specific implementation, REGs in each group may be interleaved by using the foregoing row-in-column-out interleaver and by using a REG set or a REG bundle as a granularity, and columns may be re-arranged. Details are not further described herein.

In the method in the foregoing embodiment, REGs corresponding to the control resource set are grouped based on the REG bundle size or the REG bundle pattern, and interleaving is performed within each group by using a REG set or a REG bundle as a granularity. DMRSs in the REG set or the REG bundle can be used to perform joint channel estimation, thereby improving channel estimation precision. In addition, resource conflicts between CCEs corresponding to different groups can be effectively reduced, thereby effectively avoiding a resource collision between different control channels. Moreover, that the REG bundle is used as an interleaving granularity may be predefined or obtained through configuration, so that a resource granularity of the control channel can match that of a data channel. Furthermore, through grouping, the control channel and the data channel can be coordinated to respectively reuse different control resource areas, thereby effectively improving resource use efficiency.

In a specific implementation, manners of grouping and interleaving REG sets or REG bundles corresponding to the control resource set based on the REG bundle size or the REG bundle pattern include but are not limited to the following two manners:

Manner 1: REGs on each symbol of the control resource set are interleaved respectively.

In the foregoing embodiment, REGs on each symbol of the control resource set form a group. The REGs on each symbol are interleaved based on the REG bundle size or the REG bundle pattern by using a REG set or REG bundle as an interleaving granularity.

For example, REGs on two symbols shown in FIG. 18 are separately interleaved by using the foregoing interleaver to obtain REG set or REG bundle indexes and corresponding REG indexes, as shown in FIG. 21. In this embodiment, frequency-first CCE-to-REG mapping can be implemented.

In the foregoing embodiment, REGs or REG sets or REG bundles corresponding to a CCE or a control channel are distributed on a same symbol but in different frequencies. A frequency diversity gain can be obtained. In addition, the control channel may be located on a single symbol, so that fast hybrid automatic repeat request (HARQ)-acknowledgment/negative acknowledgment (ACK/NACK) feedback can be implemented. Moreover, this is particularly applicable to a URLLC service scenario. Furthermore, resource collisions between different control channels can be effectively reduced.

Manner 2: grouping with equal-space is performed, based on a REG set, on all REGs corresponding to the control resource set, and interleaving is performed within each group by using the REG set as a granularity.

Figure 24:
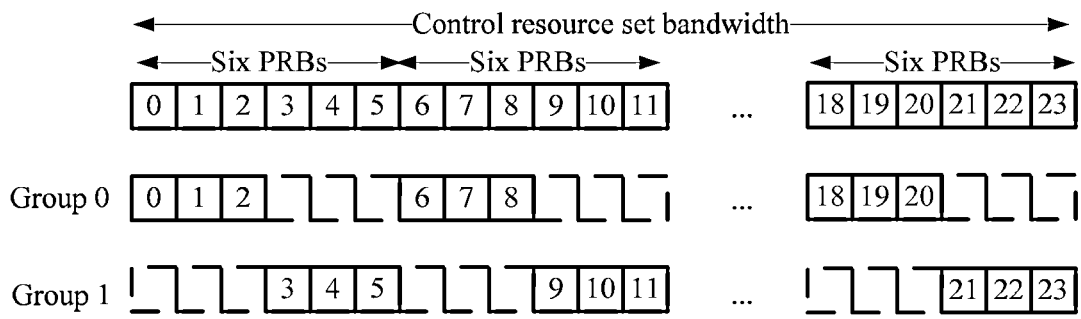
FIG. 24 is a schematic diagram of a grouping manner according to this application.

A REG bundle size of 3 in frequency domain or a bundle size of 3 in frequency domain in a REG bundle pattern is used as an example, as shown in FIG. 24. A group 0 is formed based on a REG set or REG bundle index mod 2=0, and a group 1 is formed based on a REG set or REG bundle index mod 2=1, where mod indicates a modulo operation.

Figure 25:
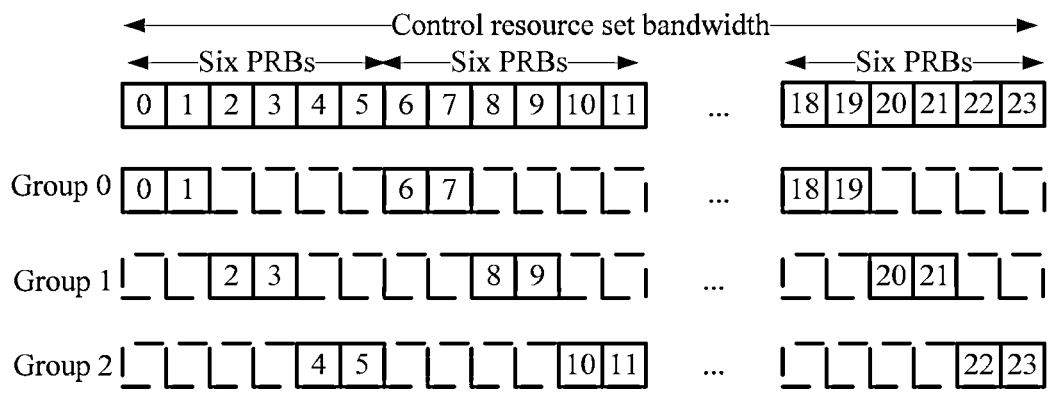
FIG. 25 is a schematic diagram of a grouping manner according to this application.

A REG bundle size of 2 in frequency domain or a bundle size of 2 in frequency domain in a REG bundle pattern is used as an example, as shown in FIG. 25. A group 0 is formed based on a REG set or REG bundle index mod 3=0, a group 1 is formed based on a REG set or REG bundle index mod 3=1, and a group 2 is formed based on a REG set or REG bundle index mod 3=2, where mod indicates a modulo operation.

Figure 26:
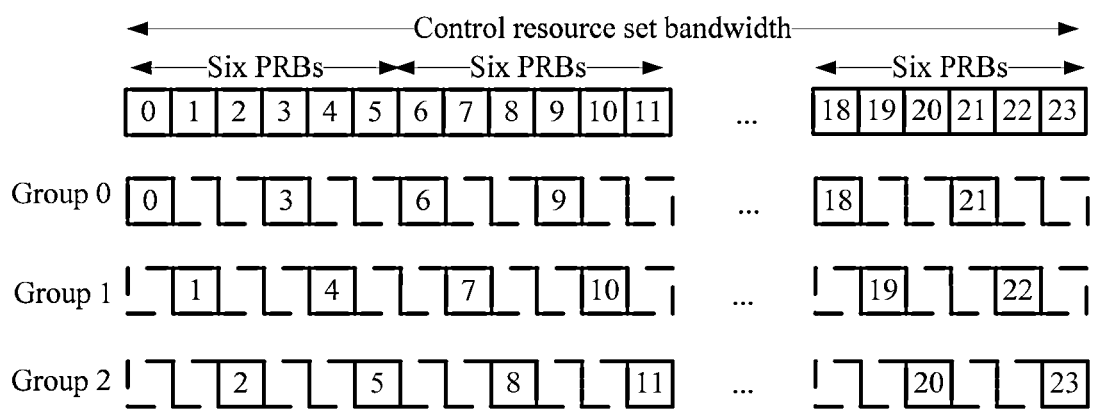
FIG. 26 is a schematic diagram of a grouping manner according to this application.

A REG bundle size of 2 or 3 in time domain or a bundle size of 2 or 3 in time domain in a REG bundle pattern is used as an example, as shown in FIG. 26. A group 0 is formed based on a REG set or REG bundle index mod 3=0, a group 1 is formed based on a REG set or REG bundle index mod 3=1, and a group 2 is formed based on a REG set or REG bundle index mod 3=2, where mod indicates a modulo operation.

Figure 27:
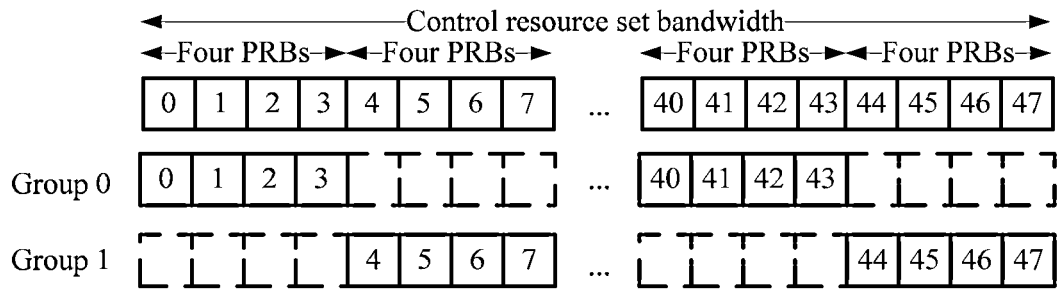
FIG. 27 is a schematic diagram of a grouping manner according to this application.

A REG bundle size of 4 in frequency domain or a bundle size of 4 in frequency domain in a REG bundle pattern is used as an example, as shown in FIG. 27. A group 0 is formed based on a REG set or REG bundle index mod 2=0, and a group 1 is formed based on a REG set or REG bundle index mod 2=1, where mod indicates a modulo operation.

Figure 28:
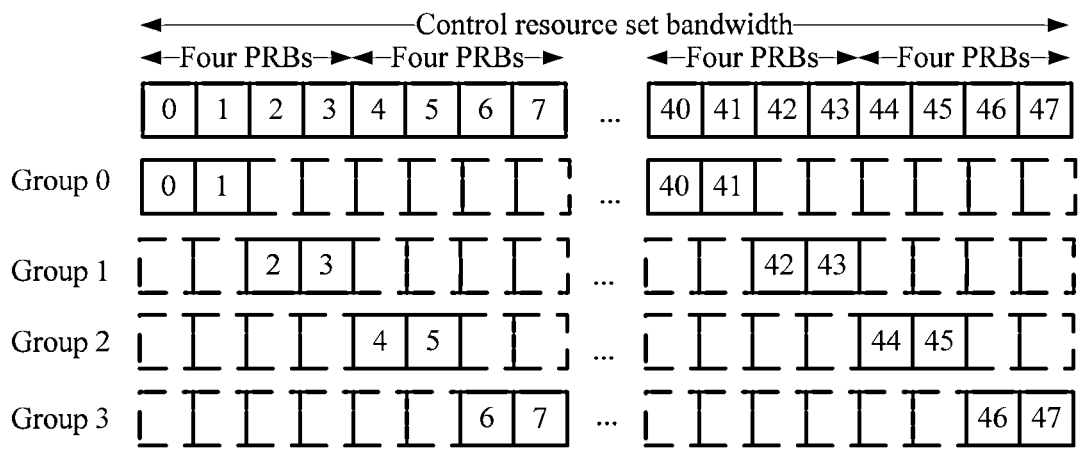
FIG. 28 is a schematic diagram of a grouping manner according to this application.

A REG bundle size of 2 in frequency domain or a bundle size of 2 in frequency domain in a REG bundle pattern is used as an example, as shown in FIG. 28. A group i, where i=0, 1, 2, or 3, is formed based on a REG set or REG bundle index mod 4=i, where mod indicates a modulo operation.

Figure 29:
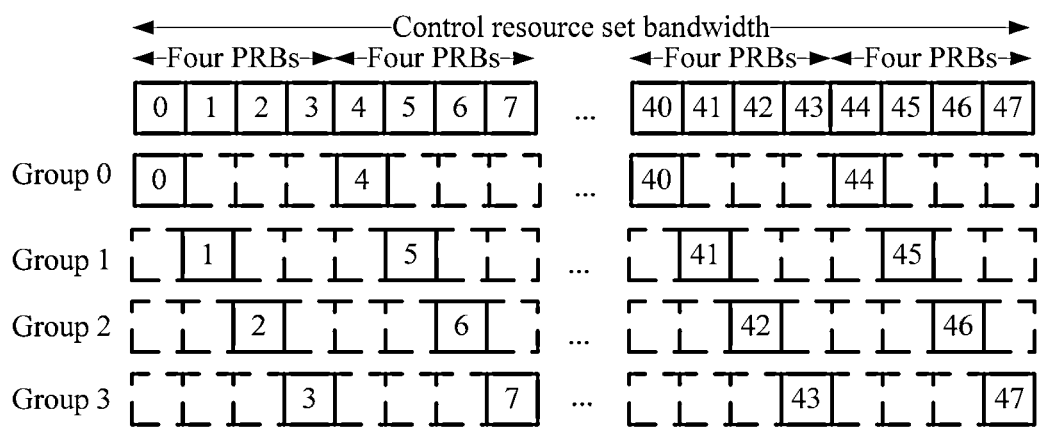
FIG. 29 is a schematic diagram of a grouping manner according to this application.

A REG bundle size of 2 or 3 in time domain or a bundle size of 2 or 3 in time domain in a REG bundle pattern is used as an example, as shown in FIG. 29. A group i, where i=0, 1, 2, or 3, is formed based on a REG set or REG bundle index mod 4=i, where mod indicates a modulo operation.

In a specific implementation, each group can be independently interleaved.

In another specific implementation, only one of the groups may be interleaved, and another group is derived by performing cyclic shifting on an index obtained based on an interleaved group, and an offset equal to a group length is introduced. For example, REG indexes after a group 1 is interleaved are 0, 8, 4, 2, 10, 6, 1, 9, 5, 3, 11, and 7; and indexes of a group 2 may be 3+12, 11+12, 7+12, 0+12, 8+12, 4+12, 2+12, 10+12, 6+12, 1+12, 9+12, and 5+12.

To improve a spectrum resource use rate, 5G NR allows a traffic channel to reuse resources of a control channel. A base station configures, by using higher layer signaling such as Radio Resource Control (RRC) signaling, a control resource set (CORESET) that can be used by user equipment (UE). Each occasion of sending a control channel depends on a channel condition and a control channel format or a payload, and a physical resource actually used by the control channel may be a part of the configured control resource set CORESET. In this case, another resource in the control resource set CORESET can be used for the traffic channel such as a downlink shared channel (PDSCH). In this case, resource reuse problems of a control channel and a data channel in a control resource area need to be resolved.

In the method in the foregoing embodiment, the REGs corresponding to the control resource set are grouped based on the REG bundle size or the REG bundle pattern, and interleaving is performed within each group by using a REG set or a REG bundle as a granularity. A DMRS in the REG set or the REG bundle can be used to perform joint channel estimation, thereby improving channel estimation precision. In addition, resource conflicts between CCEs corresponding to different groups can be effectively reduced, thereby effectively avoiding a resource collision between different control channels. Moreover, that the REG bundle is used as an interleaving granularity may be predefined or obtained through configuration, so that a resource granularity of the control channel can match that of the data channel. Furthermore, through grouping, the control channel and the data channel can be coordinated to respectively reuse different control resource areas, thereby effectively improving resource use efficiency.

In a specific implementation, REGs corresponding to the control resource set may alternatively be grouped and interleaved based on configuration information of the control resource set, to obtain interleaved REG indexes.

The configuration information of the control resource set may be the REG bundle size or the REG bundle pattern or a quantity of resource blocks or symbols in the control resource set.

In a specific implementation, the base station uses an interleaver to perform the grouping and interleaving. The method 100 further includes the following steps:

Step E: The network device determines, based on a resource size of the control resource set, a quantity of columns of an interleaving matrix used by the interleaver.

Step F: The user equipment determines, based on the resource size of the control resource set, the quantity of columns of the interleaving matrix used by the interleaver.

Alternatively:

Step F: The network device notifies, by using indication information, the UE of the quantity of columns of the interleaving matrix used by the interleaver. The indication information may be higher layer signaling, for example, RRC signaling or a MAC information element.

Step G: The user equipment receives the indication information sent by the network device, where the indication information is used to notify the UE of the quantity of columns of the interleaving matrix used by the interleaver. The indication information may be higher layer signaling, for example, RRC signaling or a MAC information element.

Specifically, in step F and step G, the network device determines, based on a current resource use status and a channel condition of the UE, the quantity of columns of the interleaving matrix used by the interleaver. When the UE is in a poor channel condition, for example, is located in an edge area of a cell, the control channel uses a relatively large quantity of physical resources, and there are a relatively large quantity of corresponding CCEs. In this case, the quantity of columns of the interleaver is properly increased. After the network device determines the quantity of columns of the interleaving matrix, the UE is notified, by using the indication information, of the quantity of columns of the interleaving matrix used by the interleaver.

In the method in the foregoing embodiment, the REGs corresponding to the control resource set are grouped based on the REG bundle size or the REG bundle pattern, and interleaving is performed within each group by using a REG set or a REG bundle as a granularity. A DMRS in the REG set or the REG bundle can be used to perform joint channel estimation, thereby improving channel estimation precision. In addition, resource conflicts between CCEs corresponding to different groups can be effectively reduced, thereby effectively avoiding a resource collision between different control channels. Moreover, that the REG bundle is used as an interleaving granularity may be predefined or obtained through configuration, so that a resource granularity of the control channel can match that of a data channel. Furthermore, through grouping, the control channel and the data channel can be coordinated to respectively reuse different control resource areas, thereby effectively improving resource use efficiency.

It should be noted that step C and step D described above may be performed by the network device, or may be performed by the user equipment.

The following describes an apparatus corresponding to the foregoing method embodiment with reference to the accompanying drawings.

Figure 30:
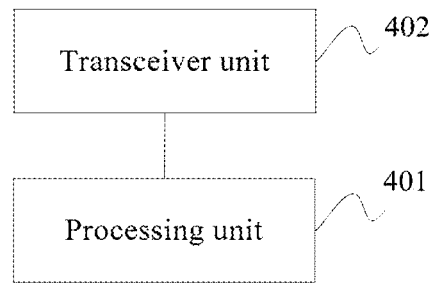
FIG. 30 is a schematic diagram of a network device according to this application.

FIG. 30 is a schematic diagram of a network device 400 according to an embodiment of this application. The network device 400 can be applied to the scenario shown in FIG. 1, and configured to perform the method 100 corresponding to FIG. 15. As shown in FIG. 30, the network device 400 includes a processing unit 401 and a transceiver unit 402. The transceiver unit 402 may be specifically configured to perform various information transmitting and receiving that are performed by the network device in the method 100. The processing unit 401 is specifically configured to perform other processing that is performed by the network device in the method 100 and that is different from information transmitting and receiving.

For example, the processing unit 401 is configured to determine a quantity and a position of a control channel element CCE used by a control channel of user equipment, where each of the CCE corresponds to a plurality of resource element groups REGs, the plurality of REGs form at least one REG set, any REG set in the at least one REG set includes a plurality of physical resource blocks PRBs that are consecutive in at least one dimensions of time domain and frequency domain, REGs in any REG set are in one-to-one correspondence with the PRBs, and the plurality of PRBs belong to a control channel resource set. The transceiver unit 402 is configured to send control information to the user equipment by using the CCE determined by the processing unit.

For specific content, refer to description of a related part in the method 100. Details are not described herein again.

Figure 31:
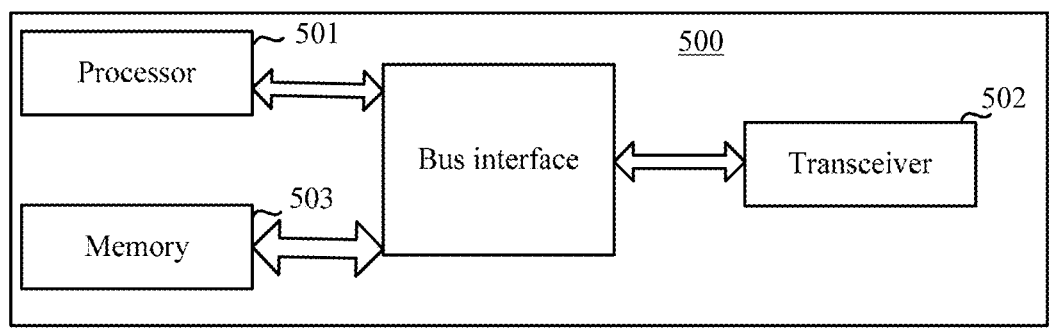
FIG. 31 is a schematic diagram of a network device according to this application.

It should be understood that the foregoing unit division is merely logical function division, and some or all of the units may be integrated into a physical entity, or may be physically separate. In this embodiment of this application, the transceiver unit 402 may be implemented by a transceiver, and the processing unit 401 may be implemented by a processor. As shown in FIG. 31, a network device 500 may include a processor 501, a transceiver 502, and a memory 503. The memory 503 may be configured to store a program/code preinstalled on the network device 500 at delivery, or may store code executed by the processor 501, and the like.

It should be understood that the network device 500 in this embodiment of this application may correspond to the network device in the method 100 in the embodiment of this application. The transceiver 502 is configured to perform various information transmitting and receiving that are performed by the network device in the method 100. The processor 501 is configured to perform other processing that is performed by the network device in the method 100 and that is different from information transmitting and receiving. Details are not described herein again.

Figure 32:
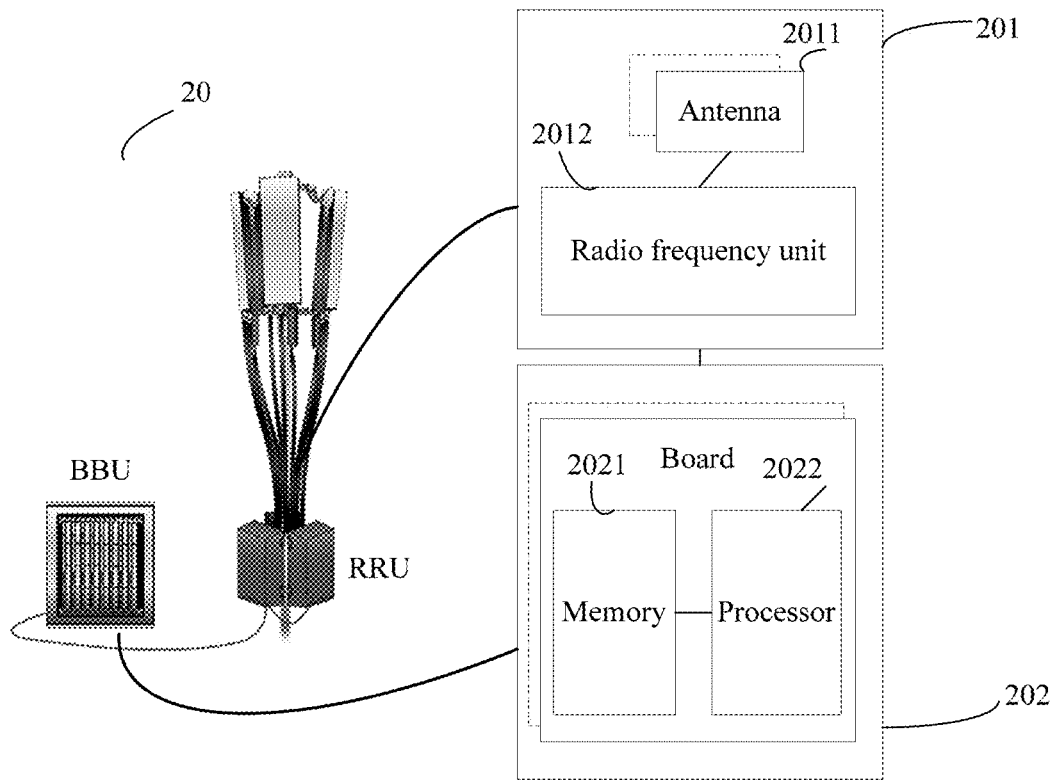
FIG. 32 is a schematic diagram of a network device according to this application.

FIG. 32 is a schematic structural diagram of a network device 20. The network device 20 may be, for example, a base station. The network device 20 can be applied to the system shown in FIG. 1, to perform the method corresponding to FIG. 15. The network device 20 includes one or more remote radio units (RRU) 201 and one or more baseband units (BBU) 202. The RRU 201 may be referred to as a transceiver unit, a transceiver, a transceiver circuit, a transceiver device, or the like, and may include at least one antenna 2011 and a radio frequency unit 2012. The RRU 201 is mainly configured to transmit and receive a radio frequency signal and perform conversion between a radio frequency signal and a baseband signal. For example, the RRU 201 is configured to perform various information transmitting and receiving that are performed by the network device in the foregoing method 100. The BBU 202 is mainly configured to perform baseband processing, control the network device, and the like. The RRU 201 and the BBU 202 may be physically disposed together, or may be physically disposed separately, for example, may be on distributed base stations.

The BBU 202 is a control center of the network device, and may also be referred to as a processing unit. The BBU 202 is mainly configured to complete baseband processing functions, such as channel coding, multiplexing, modulation, and spectrum spreading. For example, the BBU (processing unit) may be configured to control the network device to perform other processing that is different from information transmitting and receiving in the method 100.

In an example, the BBU 202 may include one or more boards. A plurality of boards can jointly support a radio access network (such as an LTE network) in a single access standard, or may support radio access networks in different access standards. The BBU 202 may further include a memory 2021 and a processor 2022. The memory 2021 is configured to store necessary instructions and data. For example, the memory 2021 stores the codebooks C1 and C2 and/or the codebook C in the foregoing embodiment. The processor 2022 is configured to control the network device to perform a necessary action, for example, configured to control the network device to perform other processing that is different from information transmitting and receiving in the foregoing method 100. The memory 2021 and the processor 2022 can serve one or more boards. To be specific, a memory and a processor may be separately disposed on each board. Alternatively, a plurality of boards may share a same memory and a same processor. In addition, a necessary circuit is further disposed on each board.

Figure 33:
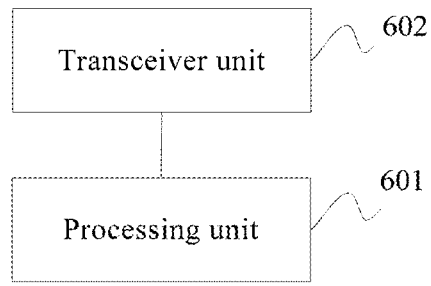
FIG. 33 is a schematic diagram of user equipment according to this application.

FIG. 33 is a schematic diagram of a terminal device 600 according to an embodiment of this application. The terminal device 600 can be applied to the scenario shown in FIG. 1, to perform the method corresponding to FIG. 15. As shown in FIG. 33, the terminal device 600 includes a processing unit 601 and a transceiver unit 602. The transceiver unit 602 may be specifically configured to perform various information transmitting and receiving that are performed by the terminal device in the method 100. The processing unit 601 is specifically configured to perform other processing that is performed by the terminal device in the method 100 and that is different from information transmitting and receiving.

For example, the processing unit 601 is configured to determine a quantity and a position of a control channel element CCE used by a control channel of the communication apparatus, where each of the CCE corresponds to a plurality of resource element groups REGs, the plurality of REGs form at least one REG set, any REG set in the at least one REG set includes a plurality of physical resource blocks PRBs that are consecutive in at least one dimensions of time domain and frequency domain, REGs in any REG set are in one-to-one correspondence with the PRBs, and the plurality of PRBs belong to a control channel resource set. The transceiver unit 602 is configured to receive control information from the network device by using the CCE determined by the processor.

For specific content, refer to specific description of the foregoing method 100. Details are not described herein again.

Figure 34:
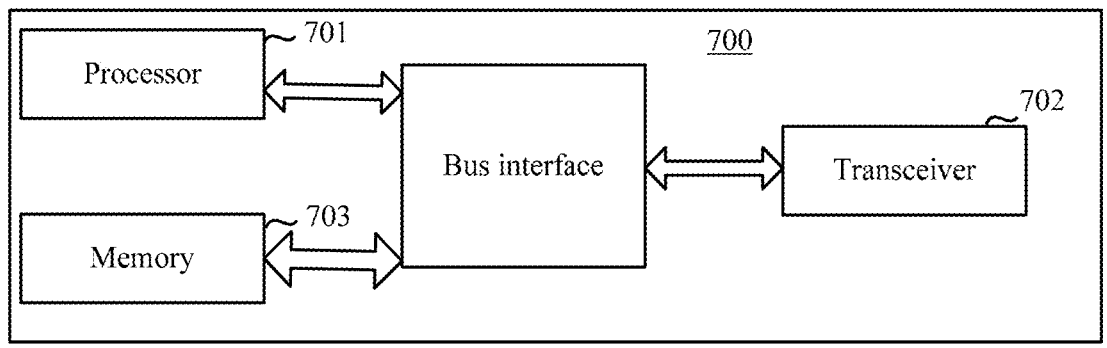
FIG. 34 is a schematic diagram of user equipment according to this application.

It should be understood that the foregoing unit division is merely logical function division, and some or all of the units may be integrated into a physical entity, or may be physically separate. In this embodiment of this application, the transceiver unit 602 may be implemented by a transceiver, and the processing unit 601 may be implemented by a processor. As shown in FIG. 34, a terminal device 700 may include a processor 701, a transceiver 702, and a memory 703. The memory 703 may be configured to store a program/code preinstalled on the terminal device 700 at delivery, or may store code executed by the processor 701, and the like.

It should be understood that the terminal device 700 in this embodiment of this application may correspond to the terminal device in the method 100 in the embodiment of this application. The transceiver 702 is configured to perform various information transmitting and receiving that are performed by the terminal device in the method 100. The processor 701 is configured to perform other processing that is performed by the terminal device in the method 100 and that is different from information transmitting and receiving. Details are not described herein again.

Figure 35:
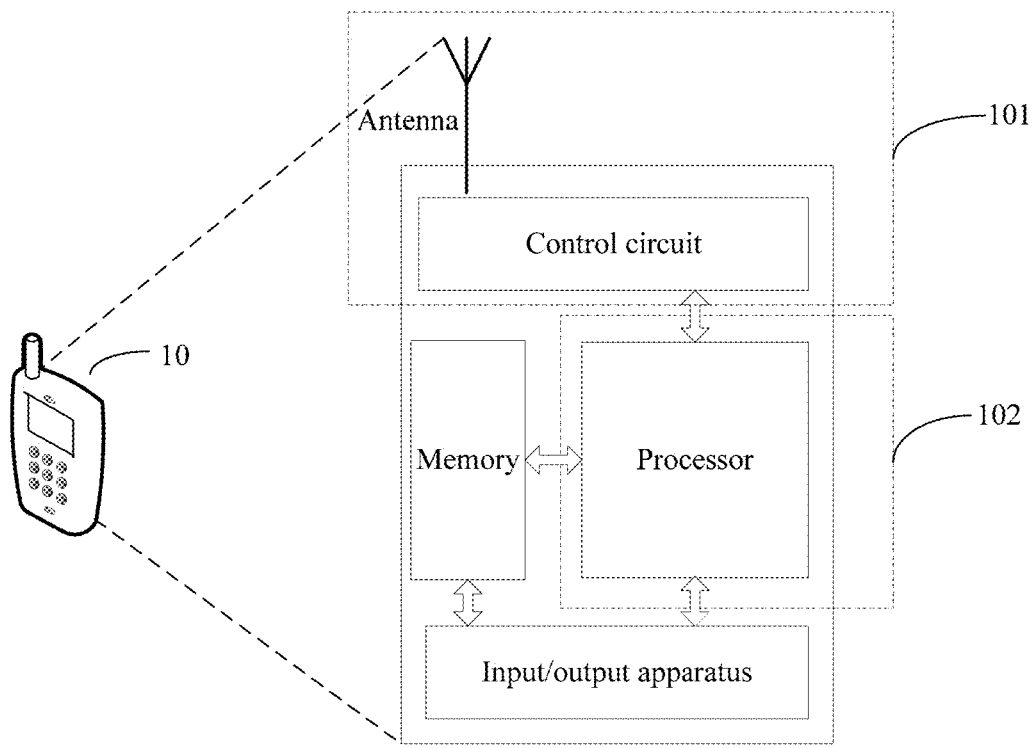
FIG. 35 is a schematic diagram of user equipment according to this application.

FIG. 35 is a schematic structural diagram of a terminal device. The terminal device can be applied to the scenario shown in FIG. 1, to perform the method corresponding to FIG. 15. For ease of description, FIG. 35 shows only main components of the terminal device. As shown in FIG. 35, a terminal device 10 includes a processor, a memory, a control circuit, an antenna, and an input/output apparatus. The control circuit is mainly configured to perform conversion between a baseband signal and a radio frequency signal, and process the radio frequency signal. The control circuit and the antenna together may also be referred to as a transceiver device, mainly configured to transmit and receive a radio frequency signal in a form of an electromagnetic wave, and receive a signaling instruction and/or a reference signal sent by a base station, and configured to perform various information transmitting and receiving that are performed by the terminal device in the foregoing method 100. For details, refer to description of the foregoing related parts. The processor is mainly configured to process a communications protocol and communication data, control the entire terminal device, execute a software program, and process data of the software program, for example, configured to support the terminal device in performing an action different from information transmitting and receiving in the method 100. The memory is mainly configured to store a software program and data. The input/output apparatus such as a touchscreen, a display, or a keyboard is mainly configured to receive data input by a user and output data to the user.

After the terminal device is powered on, the processor can read a software program in a storage unit, interpret and execute an instruction of the software program, and process data of the software program. When data needs to be sent in a wireless manner, the processor performs baseband processing on the to-be-sent data, and then outputs a baseband signal to a radio frequency circuit. The radio frequency circuit performs radio frequency processing on the baseband signal, and then sends the radio frequency signal in a form of an electromagnetic wave by using an antenna. When data is sent to the terminal device, the radio frequency circuit receives a radio frequency signal by using the antenna, converts the radio frequency signal into a baseband signal, and outputs the baseband signal to the processor. The processor converts the baseband signal into data and processes the data.

A person skilled in the art may understand that, for ease of description, FIG. 35 shows only one memory and one processor. In actual user equipment, there may be a plurality of processors and memories. The memory may also be referred to as a storage medium or a storage device. This is not limited in this embodiment of this application.

In a specific implementation, the processor may include a baseband processor and a central processing unit. The baseband processor is mainly configured to process a communications protocol and communication data. The central processing unit is mainly configured to control the entire terminal device, execute a software program, and process data of the software program. Functions of the baseband processor and the central processing unit are integrated in the processor in FIG. 35. A person skilled in the art may understand that the baseband processor and the central processing unit may alternatively be independent processors connected to each other by using technologies such as a bus. A person skilled in the art may understand that the terminal device may include a plurality of baseband processors, to adapt to different network standards. The terminal device may include a plurality of central processing units to enhance a processing capability of the terminal device. Components of the terminal device may be connected by using various buses. The baseband processor may also be described as a baseband processing circuit or a baseband processing chip. The central processing unit may also be described as a central processing circuit or a central processing chip. Functions of processing the communications protocol and the communication data may be built in the processor, or may be stored in a storage unit in a form of a software program, and the processor executes the software program to implement baseband processing functions.

For example, in this embodiment of this application, an antenna having transmitting and receiving functions and a control circuit may be considered as a transceiver unit 101 of the terminal device 10, and a processor having a processing function may be considered as a processing unit 102 of UE 10. As shown in FIG. 35, the terminal device 10 includes the transceiver unit 101 and the processing unit 102. The transceiver unit may also be referred to as a transceiver device, a transceiver, a transceiver apparatus, or the like. In a specific implementation, a device, configured to implement a receiving function, in the transceiver unit 101 may be considered as a receiving unit, and a device, configured to implement a transmitting function, in the transceiver unit 101 may be considered as a transmitting unit. In other words, the transceiver unit 101 includes a receiving unit and a transmitting unit. For example, the receiving unit may also be referred to as a receiver, a receiving device, a receiving circuit, or the like. The transmitting unit may be referred to as a transmitter, a transmitting device, a transmitting circuit, or the like.

In the embodiments of this application, the transceiver may be a wired transceiver, a wireless transceiver, or a combination thereof. The wired transceiver may be, for example, an Ethernet interface. The Ethernet interface may be an optical interface, an electrical interface, or a combination thereof. The wireless transceiver may be, for example, a wireless local area network transceiver, a cellular network transceiver, or a combination thereof. The processor may be a central processing unit (CPU), a network processor (NP), or a combination of the CPU and the NP. The processor may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof. The memory may include a volatile memory, for example, a random access memory (RAM). The memory may also include a nonvolatile memory, for example, a read-only memory (ROM), a flash memory, a hard disk HDD) or a solid state disk (SSD). The memory may further include a combination of the foregoing types of memories.

In FIG. 31 and FIG. 34, a bus interface may be further included. The bus interface may include any quantity of interconnected buses and bridges, specifically, one or more processors represented by the processor and various circuits of memories represented by the memory are connected together. The bus interface may further connect various other circuits such as a peripheral device, a voltage stabilizer, and a power management circuit together, which is well known in the art. Therefore, details are not further described in this specification. The bus interface provides an interface. The transceiver provides a unit configured to communicate with various other devices on a transmission medium. The processor is responsible for bus architecture management and general processing, and the memory can store data used by the processor for performing an operation.

A person skilled in the art may further understand that various illustrative logical blocks and steps that are listed in the embodiments of this application may be implemented by using electronic hardware, computer software, or a combination thereof. Whether the functions are implemented by using hardware or software depends on particular applications and a design requirement of the entire system. A person skilled in the art may use various methods to implement the described functions for each particular application, but it should not be considered that the implementation goes beyond the scope of the embodiments of this application.

The various illustrative logical units and circuits described in the embodiments of the present invention may implement or operate the described functions by using a general processor, a digital signal processor, an application-specific integrated circuit (ASIC), a field programmable gate array (FPGA) or another programmable logical apparatus, a discrete gate or transistor logic, a discrete hardware component, or a design of any combination thereof. The general processor may be a microprocessor. In a specific implementation, the general processor may also be any conventional processor, controller, microcontroller, or state machine. The processor may also be implemented by a combination of computing apparatuses, such as a digital signal processor and a microprocessor, a plurality of microprocessors, one or more microprocessors with a digital signal processor core, or any other similar configuration.

Steps of the methods or algorithms described in the embodiments of this application may be directly embedded into hardware, a software unit executed by a processor, or a combination thereof. The software unit may be stored in a RAM memory, a flash memory, a ROM memory, an EPROM memory, an EEPROM memory, a register, a hard disk, a removable magnetic disk, a CD-ROM, or a storage medium of any other form in the art. For example, the storage medium may connect to a processor, so that the processor may read information from the storage medium and write information to the storage medium. In a specific implementation, the storage medium may also be integrated into the processor. The processor and the storage medium may be disposed in an ASIC, and the ASIC may be disposed in UE. In a specific implementation, the processor and the storage medium may also be disposed in different components of the UE.

It should be understood that sequence numbers of the foregoing processes do not mean execution sequences in various embodiments of this application. The execution sequences of the processes should be determined according to functions and internal logic of the processes, and should not be construed as any limitation on the implementation processes of the embodiments of this application.

All or some of the foregoing embodiments may be implemented by using software, hardware, firmware, or any combination thereof. When software is used to implement the embodiments, the embodiments may be implemented partially in a form of a computer program product. The computer program product includes one or more computer instructions. When the computer program instructions are loaded and executed on the computer, the procedure or functions according to the embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk (SSD)), or the like.

The embodiments in this specification are all described in a progressive manner, for same or similar parts in the embodiments, refer to these embodiments, and each embodiment focuses on a difference from other embodiments. Especially, apparatus and system embodiments are basically similar to a method embodiment, and therefore are described briefly; for related parts, refer to partial descriptions in the method embodiment.

According to the foregoing description of this specification in this application, technologies in the art may use or implement the content of this application. Any modification based on the disclosed content shall be considered obvious in the art. The basic principles described in this application may be applied to other variations without departing from the essence and scope of this application. Therefore, the content disclosed in this application is not limited to the described embodiments and designs but may also be extended to a maximum scope that is consistent with the principles and disclosed new features of this application.

The invention claimed is:

1. An apparatus, comprising:
   at least one processor; and
   one or more memories coupled to the at least one processor and storing programming instructions for execution by the at least one processor to perform operations comprising:
   receiving information about a control resource set, wherein the control resource set consists of K resource blocks (RBs) in frequency domain and one or more symbols in time domain, the K RBs and the one or more symbols form M resource element groups (REGs), each of the M REGs consists of one RB and one symbol, and wherein indexes of the M REGs are obtained by numbering the M REGs consecutively in an increasing order in a time-first manner;

determining one or more control channel elements (CCEs) for a control channel, wherein a quantity of REGs included in any of one or more first REG bundles is L, wherein K, M, and L are positive integers, and wherein K>1; and receiving the control channel using the one or more CCEs, wherein:

when L=3, any of the one or more first REG bundles consists of three consecutive symbols in time domain and one REG in frequency domain; and when L=6, any of the one or more first REG bundles consists of one symbol in time domain and six REGs in frequency domain, two consecutive symbols in time domain and three REGs in frequency domain, or three consecutive symbols in time domain and two REGs in frequency domain.

2. The apparatus according to claim 1, wherein the one or more first REG bundles are determined by interleaving one or more consecutive REG bundle indexes.

3. The apparatus according to claim 2, wherein L is used as an interleaving granularity.

4. The apparatus according to claim 2, wherein indexes corresponding to REGs included in any of the one or more first REG bundles are consecutive.

5. The apparatus according to claim 1, wherein a CCE with CCE index j consists of the one or more first REG bundles with indexes $\{f(6j/L), f(6j/L+1), \ldots, f(6j/L+P-1)\}$, wherein $f(\bullet)$ is an interleaver, wherein P is a quantity of the one or more first REG bundles, and wherein j is an integer greater than or equal to 0.

6. The apparatus according to claim 1, wherein when L=6, a CCE with CCE index j consists of REGs with REG indexes 6j, 6j+1, 6j+2, 6j+3, 6j+4, 6j+5, and wherein j is an integer greater than or equal to 0.

7. The apparatus according to claim 1, wherein the operations further comprise receiving higher layer signaling indicating L, or wherein L is predefined.

8. An apparatus, comprising:
at least one processor; and
one or more memories coupled to the at least one processor and storing programming instructions for execution by the at least one processor to perform operations comprising:

transmitting, to a terminal device, information about a control resource set, wherein the control resource set consists of K resource blocks (RBs) in frequency domain and one or more symbols in time domain, the K RBs and the one or more symbols form M resource element groups (REGs), each of the M REGs consists of one RB and one symbol, and wherein indexes of the M REGs are obtained by numbering the M REGs consecutively in an increasing order in a time-first manner;

determining one or more control channel elements (CCEs) for a control channel, wherein a quantity of REGs included in any of one or more first REG bundles is L, wherein K, M, and L are positive integers, and wherein K>1; and transmitting the control channel using the one or more CCEs, wherein:

when L=3, any of the one or more first REG bundles consists of three consecutive symbols in time domain and one REG in frequency domain; and when L=6, any of the one or more first REG bundles consists of one symbol in time domain and six REGs in frequency domain, two consecutive symbols in time domain and three REGs in frequency domain, or three consecutive symbols in time domain and two REGs in frequency domain.

9. The apparatus according to claim 8, wherein the one or more first REG bundles are determined by interleaving one or more consecutive REG bundle indexes.

10. The apparatus according to claim 9, wherein L is used as an interleaving granularity.

11. The apparatus according to claim 9, wherein indexes corresponding to REGs included in any of the one or more first REG bundles are consecutive.

12. The apparatus according to claim 8, wherein a CCE with CCE index j consists of the one or more first REG bundles with indexes $\{f(6j/L), f(6j/L+1), \ldots, f(6j/L+P-1)\}$, wherein $f(\bullet)$ is an interleaver, wherein P is a quantity of the one or more first REG bundles, and wherein j is an integer greater than or equal to 0.

13. The apparatus according to claim 8, wherein when L=6, a CCE with CCE index j consists of REGs with REG indexes 6j, 6j+1, 6j+2, 6j+3, 6j+4, 6j+5, and wherein j is an integer greater than or equal to 0.

14. The apparatus according to claim 8, wherein the operations further comprise transmitting higher layer signaling indicating L, or wherein L is predefined.

15. A non-transitory computer-readable medium storing instructions which, when executed by at least one processor, cause the at least one processor to perform operations comprising:

receiving information about a control resource set, wherein the control resource set consists of K resource blocks (RBs) in frequency domain and one or more symbols in time domain, the K RBs and the one or more symbols form M resource element groups (REGs), each of the M REGs consists of one RB and one symbol, and wherein indexes of the M REGs are obtained by numbering the M REGs consecutively in an increasing order in a time-first manner;

determining one or more control channel elements (CCEs) for a control channel, wherein a quantity of REGs included in any of one or more first REG bundles is L, wherein K, M, and L are positive integers, and wherein K>1; and receiving the control channel using the one or more CCEs, wherein:

when L=3, any of the one or more first REG bundles consists of three consecutive symbols in time domain and one REG in frequency domain; and when L=6, any of the one or more first REG bundles consists of one symbol in time domain and six REGs in frequency domain, two consecutive symbols in time domain and three REGs in frequency domain, or three consecutive symbols in time domain and two REGs in frequency domain.

16. The medium according to claim 15, wherein the one or more first REG bundles are determined by interleaving one or more consecutive REG bundle indexes.

17. The medium according to claim 16, wherein L is used as an interleaving granularity.

18. The medium according to claim 16, wherein indexes corresponding to REGs included in any of the one or more first REG bundles are consecutive.

19. The medium according to claim 15, wherein a CCE with CCE index j consists of the one or more first REG bundles with indexes {f(6j/L), f(6j/L+1), ..., f(6j/L+P−1)}, wherein f(•) is an interleaver, wherein P is a quantity of the one or more first REG bundles, and wherein j is an integer greater than or equal to 0.

20. The medium according to claim 15, wherein when L=6, a CCE with CCE index j consists of REGs with REG indexes 6j, 6j+1, 6j+2, 6j+3, 6j+4, 6j+5, and wherein j is an integer greater than or equal to 0.

21. The medium according to claim 15, wherein the operations further comprise receiving higher layer signaling indicating L, or wherein L is predefined.

22. A non-transitory computer-readable medium storing instructions which, when executed by at least one processor, cause the at least one processor to perform operations comprising:
    transmitting, to a terminal device, information about a control resource set, wherein the control resource set consists of K resource blocks (RBs) in frequency domain and one or more symbols in time domain, the K RBs and the one or more symbols form M resource element groups (REGs), each of the M REGs consists of one RB and one symbol, and wherein indexes of the M REGs are obtained by numbering the M REGs consecutively in an increasing order in a time-first manner;
    determining one or more control channel elements (CCEs) for a control channel, wherein a quantity of REGs included in any of one or more first REG bundles is L, wherein K, M, and L are positive integers, and wherein K>1; and
    transmitting the control channel using the one or more CCEs, wherein:
        when L=3, any of the one or more first REG bundles consists of three consecutive symbols in time domain and one REG in frequency domain; and
        when L=6, any of the one or more first REG bundles consists of one symbol in time domain and six REGs in frequency domain, two consecutive symbols in time domain and three REGs in frequency domain, or three consecutive symbols in time domain and two REGs in frequency domain.

23. The medium according to claim 22, wherein the one or more first REG bundles are determined by interleaving one or more consecutive REG bundle indexes.

24. The medium according to claim 23, wherein L is used as an interleaving granularity.

25. The medium according to claim 23, wherein indexes corresponding to REGs included in any of the one or more first REG bundles are consecutive.

26. The medium according to claim 22, wherein a CCE with CCE index j consists of the one or more first REG bundles with indexes {f(6j/L), f(6j/L+1), ..., f(6j/L+P−1)}, wherein f(•) is an interleaver, wherein P is a quantity of the one or more first REG bundles, and wherein j is an integer greater than or equal to 0.

27. The medium according to claim 22, wherein when L=6, a CCE with CCE index j consists of REGs with REG indexes 6j, 6j+1, 6j+2, 6j+3, 6j+4, 6j+5, and wherein j is an integer greater than or equal to 0.

28. The medium according to claim 22, wherein the operations further comprise transmitting higher layer signaling indicating L, or wherein L is predefined.

* * * * *